United States Patent
Kumagai et al.

(10) Patent No.: US 6,469,356 B2
(45) Date of Patent: Oct. 22, 2002

(54) SEMICONDUCTOR MEMORY DEVICE HAVING DIFFERENT DISTANCES BETWEEN GATE ELECTRODE LAYERS

(75) Inventors: Takashi Kumagai; Masahiro Takeuchi; Satoru Kodaira, all of Chino; Takafumi Noda, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/876,058

(22) Filed: Jun. 8, 2001

(65) Prior Publication Data

US 2002/0024075 A1 Feb. 28, 2002

(30) Foreign Application Priority Data

Jun. 15, 2000 (JP) .......................... 2000-179976

(51) Int. Cl.⁷ .................. H01L 29/76; H01L 29/94; H01L 31/062; H01L 31/113; H01L 31/119
(52) U.S. Cl. .................. 257/369; 257/393; 257/903
(58) Field of Search ................ 365/154, 156, 365/161; 257/66, 67, 68, 69, 71, 334, 369, 393, 903, 904

(56) References Cited

U.S. PATENT DOCUMENTS

| 5,404,030 A | * | 4/1995 | Kim et al. | 257/67 |
| 5,691,561 A | * | 11/1997 | Goto | 257/369 |
| 5,973,369 A | * | 10/1999 | Hayashi | 257/369 |
| 6,081,016 A | * | 6/2000 | Tanaka et al. | 257/377 |
| 6,160,298 A | * | 12/2000 | Ohkubu | 257/393 |

FOREIGN PATENT DOCUMENTS

| JP | 404162473 A | * | 6/1992 |
| JP | 10-41409 A | | 2/1998 |
| JP | 410032263 A | * | 2/1998 |

OTHER PUBLICATIONS

U.S. patent application Ser. No. 09/876,068, filed Jun. 8, 2001, Kumagai et al.
U.S. patent application Ser. No. 09/876,059, filed Jun. 8, 2001, Kumagai et al.
U.S. patent application Ser. No. 09/876,056, filed Jun. 8, 2001, Kumagai et al.
IEDM Technical Digest 1998 by M. Ishida et al.

* cited by examiner

Primary Examiner—Olik Chaudhuri
Assistant Examiner—Hoai Pham
(74) Attorney, Agent, or Firm—Oliff & Berridge, PLC

(57) ABSTRACT

The invention provides SRAMs that can reduce memory cells in size and correct light proximity effect. Gate electrode layers in a first layer, drain-drain connection layers in a second layer, and drain-gate connection layers in a third layer define conduction layers of a flip-flop. A source contact layer of load transistors are located adjacent end sections of the gate electrode layers, and both of the end sections bend outwardly to avoid contact with the source contact layer.

10 Claims, 16 Drawing Sheets

SEMICONDUCTOR MEMORY DEVICE HAVING DIFFERENT DISTANCES BETWEEN GATE ELECTRODE LAYERS

BACKGROUND OF THE INVENTION

1. Field of Invention

The present invention relates to semiconductor memory devices such as SRAMs (static random access memories).

2. Description of Related Art

SRAMs, one type of semiconductor memory devices, do not require a refreshing operation, and therefore have characteristics that can simplify a system in which they are incorporated and facilitate lower power consumption. For this reason, the SRAMs are prevailingly used as memories for hand-carry type equipment, such as cellular phones.

It is preferable for the hand-carry type equipment to be reduced in size. Therefore, the memory size of the SRAMs must be reduced.

SUMMARY OF THE INVENTION

It is an object of the present invention to provide a semiconductor memory device that can reduce the size of memory cells.

In accordance with the present invention, a semiconductor memory device has a memory cell including a first driver transistor, a second driver transistor, a first load transistor, a second load transistor, a first transfer transistor and a second transfer transistor. The semiconductor device includes a first gate electrode layer and a second gate electrode layer. The first gate electrode layer includes gate electrodes of the first driver transistor and the first load transistor. The second gate electrode layer includes gate electrodes of the second driver transistor and the second load transistor. The first gate electrode layer and the second gate electrode layer have linear patterns, respectively, and are disposed in parallel with each other. Distances between the first gate electrode layer and the second gate electrode layer on the side where the load transistors are located and on the side where the driver transistors are located are different from each other.

In accordance with the present invention, distances between the first gate electrode layer and the second gate electrode layer on the side where the load transistors are located and on the side where the driver transistors are located are different from each other. Accordingly, in accordance with the present invention, the memory cell region can be effectively utilized. As a result, while the memory cell can be further reduced in size, its characteristics are enhanced such that its power consumption is lowered and its operation is more stabilized. For example, the memory cell region can be effectively utilized in the following manner. The distance between the first gate electrode layer and the second gate electrode layer on the side where the driver transistors are located may be set such that a source contact layer of the driver transistors (where the source contact layer is a conduction layer that is used to connect a source region and a wiring layer) can be disposed inside a gate electrode interlayer region (where the gate electrode interlayer region is a region between the first gate electrode layer and the second gate electrode layer), and the distance between the first gate electrode layer and the second gate electrode layer on the side where the load transistors are located may be set to a minimum value on the design rule.

In accordance with the present invention, the distance between the first gate electrode layer and the second gate electrode layer on the side where the load transistors are located (for example, 0.2–0.4 $\mu$m) may be set to be shorter than the distance between the first gate electrode layer and the second gate electrode layer on the side where the driver transistors are located (for example, 0.41–0.6 $\mu$m). The first embodiment of the invention described above includes the feature that distances between the first gate electrode layer and the second gate electrode layer on the side where the load transistors are located and on the side where the driver transistors are located are different from each other. In accordance with a second embodiment of the invention, the distance between the first gate electrode layer and the second gate electrode layer on the side where the driver transistors are located (for example, 0.2–0.4 $\mu$m) may be shorter than the distance between the first gate electrode layer and the second gate electrode layer on the side where the load transistors are located (for example, 0.41–0.6 $\mu$m).

The first embodiment may be preferable in the present invention. In an SRAM memory, a current that reads the cells on the order of 100 $\mu$A flows through the driver transistors. Therefore, a parasitic resistance in the source regions of the driver transistors needs to be lowered. On the other hand, while the load transistors that function to maintain a cell node high potential side can have a smaller current capacity, an off-leak current needs to be reduced. In accordance with the first embodiment, the distance between the first gate electrode layer and the second gate electrode layer is shorter on the side where the load transistors are located than on the side where the driver transistors are located. Also, the source contact layer on the side of the driver transistors is disposed in the gate electrode interlayer region, and the source contact layer on the side of the load transistors is disposed outside to avoid the gate electrode interlayer region. Therefore, the parasitic resistance at the source sections of the driver transistors can be reduced, such that a higher and more stable operation can be realized. Also, a channel section and an area on the drain-side of the load transistor can be provided with wide regions because the distance between the first gate electrode layer and the second gate electrode layer is short. As a result, the channel length of the load transistor can be made longer than that of the driver transistor. Accordingly, the leak current resulting from the short-channel effect of the load transistor can be reduced. As a result, in accordance with the first embodiment of the present invention, the memory cell region can be effectively utilized, with the result that, while the characteristics are enhanced for lower current consumption and more stable operation, the memory cell can be further miniaturized.

In accordance with the present invention, a source contact layer for the load transistors is located adjacent to end sections of the first and second gate electrode layers on the side of the load transistors. The end sections bend outwardly to avoid contact with the source contact layer for the load transistors. In accordance with the present invention, by outwardly bending the end sections, an area of the gate electrode layer on the outside of the channel region of the load transistors (the source contact side of the load transistors) can be made large. Accordingly, even when there is an alignment error, the gate electrode layer can cover the channel region of the load transistor, whereby an increase in the channel leak current of the load transistors can be prevented. Also, in accordance with the present invention, since the end sections are outwardly bent, the shape of the end sections corrects the light proximity effect. As a result, in accordance with the present embodiment, a proximity effect correction device, such as shelves does not need to be added to the end sections.

In accordance with the present invention, the distance between the first gate electrode layer and the second gate electrode layer on the side where the load transistors are located is a minimum value on the design rule.

When the distance between the first gate electrode layer and the second gate electrode layer on the side where the load transistors are located is a minimum value on the design rule, the source resistance of the load transistors increases. However, since the load transistor has a small current capacity, its characteristics do not deteriorate. Therefore, in accordance with the present invention, the memory cell can be reduced in size without sacrificing its characteristics.

In accordance with the present invention, load transistors are p-channel type. Generally, p-channel type transistors have a greater short-channel effect (that leads to an increased punch-through current and an increased leak current in the sub-threshold region) than n-channel type transistors. In order to suppress the leak by the short channel effect, the gate length of the p-channel type transistors needs to be longer than the gate length of the n-channel type transistors. In the first embodiment described above, when the load transistors are p-channel type, the load transistors have some extra area on their drain region side even when the gate length of the load transistors is made longer. As a result, the current consumption can be reduced without increasing the memory cell area.

In accordance with the present invention, a source contact layer of the driver transistors is located in a gate electrode interlayer region defined by a region between the first gate electrode layer and the second gate electrode layer. In the first embodiment described above, the distance between the first gate electrode layer and the second gate electrode layer on the side where the driver transistors are located can be made relatively long, and therefore the source contact layer of the driver transistors can be positioned within the gate electrode interlayer region. In this manner, in accordance with the present invention, since the source contact layer of the driver transistors can be positioned within the gate electrode interlayer region, the distance between the channel section of the driver transistors and the source contact layer becomes relatively short, such that the parasitic resistance at the source section can be reduced. At the same time, the source contact layer of the driver transistors is disposed in the center of the memory cell, and does not commonly share the source contact layer with adjacent memory cells. As a result, a current that flows through the source contact layer at the time of a data reading operation is always for one cell, and an operation current of adjacent memory cells does not flow in the source contact layer. As a result, in accordance with the present invention, an increase in the potential on the source terminal, which may be caused by the parasitic resistance in the source section of the driver transistors and the reading current, can be reduced, and therefore high speed operation and stable operation can be realized. Also, since the source contact layer is located in the gate electrode interlayer region, the source contact layer of the driver transistors does not have to be considered in connection to the placement of the word lines, and the word lines can have linear layouts. Accordingly, in accordance with the present invention, the process on the word lines can be facilitated, and deviations in the width dimensions of the word lines (the channel lengths of the transfer transistors) can be reduced. Also, in accordance with the present invention, higher operation speed can be realized because the resistance of the word lines can be reduced.

The present invention further includes first and second drain-drain connection layers and first and second drain-gate connection layers. The gate electrode layers, the drain-drain connection layers and the drain-gate connection layers are located in different layers. In plan view, the first and second gate electrode layers are located between the first drain-drain connection layer and the second drain-drain connection layer. The first drain-drain connection layer connects a drain region of the first driver transistor and a drain region of the first load transistor. The second drain-drain connection layer connects a drain region of the second driver transistor and a drain region of the second load transistor. The first drain-gate connection layer connects the first drain-drain connection layer and the second gate electrode layer. The second drain-gate connection layer connects the second drain-drain connection layer and the first gate electrode layer.

The present invention is equipped with gate electrode layers that become gates of inverters, drain-drain connection layers that connect drains of the inverters, and drain-gate connection layers that connect gates of one of the inverters and drains of the other of the inverters. A semiconductor memory device in accordance with the present invention uses three layers (gate electrode layers, drain-drain connection layers, and drain-gate connection layers) to form flip-flops. Accordingly, patterns in each layer can be simplified (for example, into linear patterns) compared to the case in which flip-flops are formed using two layers. In this manner, in the semiconductor memory device in accordance with the present invention, patterns in each layer can be simplified. As a result, a miniaturized semiconductor memory device with its memory cell size being 4.5 $\mu m^2$ or smaller, for example, can be manufactured.

Also, in a semiconductor memory device in accordance with the present invention, in plan view, the first and second gate electrode layers are located between the first drain-drain connection layer and the second drain-drain connection layer. Furthermore, a wiring (located in the same layer as the drain-drain connection layer) that connects to the source contact layer can be disposed in the cell central area. As a result, the source contact layer of the driver transistors can be disposed in the central area of the memory cell. Accordingly, the degree of freedom in forming the first and second drain-gate connection layers increases. This is also advantageous with regard to reducing the memory cell size.

In accordance with the present invention, the first and second driver transistors are n-type, the first and second load transistors are p-type, and the first and second transfer transistors are n-type. The invention further includes first, second, third and fourth conduction layers. The first gate electrode layer, the second gate electrode layer and an auxiliary word line are located in the first conduction layer. The first drain-drain connection layer, the second drain-drain connection layer, a power supply line, a first contact pad layer, a second contact pad layer and a third contact pad layer are located in the second conduction layer. The first drain-gate connection layer, the second drain-gate connection layer, a main word line, a fourth contact pad layer, a fifth contact pad layer and a sixth contact pad layer are located in the third conduction layer. A first bit line, a second bit line and a grounding line are located in the fourth conduction layer. The auxiliary word line extends in a first direction. The power supply line connects to source regions of the load transistors. The first contact pad layer is used to connect the first bit line and a source/drain region of the first transfer transistor. The second contact pad layer is used to connect the second bit line and a source/drain region of the second transfer transistor. The third contact pad layer is used to connect source regions of the driver transistors and the grounding line. The main word line extends in the first direction. The fourth contact pad layer is used to connect the first bit line and a source/drain region of the first transfer transistor. The fifth contact pad layer is used to connect the second bit line and a source/drain region of the second transfer transistor. The sixth contact pad layer is used to connect source regions of the driver transistors and the grounding line. The first and second bit lines extend in a second direction which is perpendicular to the first direction.

In accordance with the present invention, a variety of characteristics required for semiconductor memory devices (for example, reduced size, reliability, stability and speed) can be enhanced in a well-balanced manner.

In accordance with the present invention, the first drain-drain connection layer and the second drain-drain connection layer have linear patterns, and the first gate electrode layer, the second gate electrode layer, the first drain-drain connection layer and the second drain-drain connection layer are disposed in parallel with one another. In accordance with the present invention, the patterns are simplified, and therefore semiconductor memory devices having miniaturized memory cells can be manufactured.

DETAILED DESCRIPTION OF PREFERRED EMBODIMENTS

A semiconductor memory device in accordance with one embodiment of the present invention is described. In this embodiment, the semiconductor memory device of the present invention is applied to an SRAM. First, a general structure of the embodiment of the present invention is described. Then, the structure is described in detail, and lastly, advantages of the present embodiment are described.

General Structure of the Present Embodiment

A semiconductor memory device in accordance with the present embodiment is a type that forms one memory cell with six MOS field effect transistors. A part of the structure that forms flip-flops of the memory cell and the structure of the memory cell are separately described to show the general structure of the present embodiment.

{Structure of Part That Forms Flip-Flops of Memory Cell}

Figure 1:
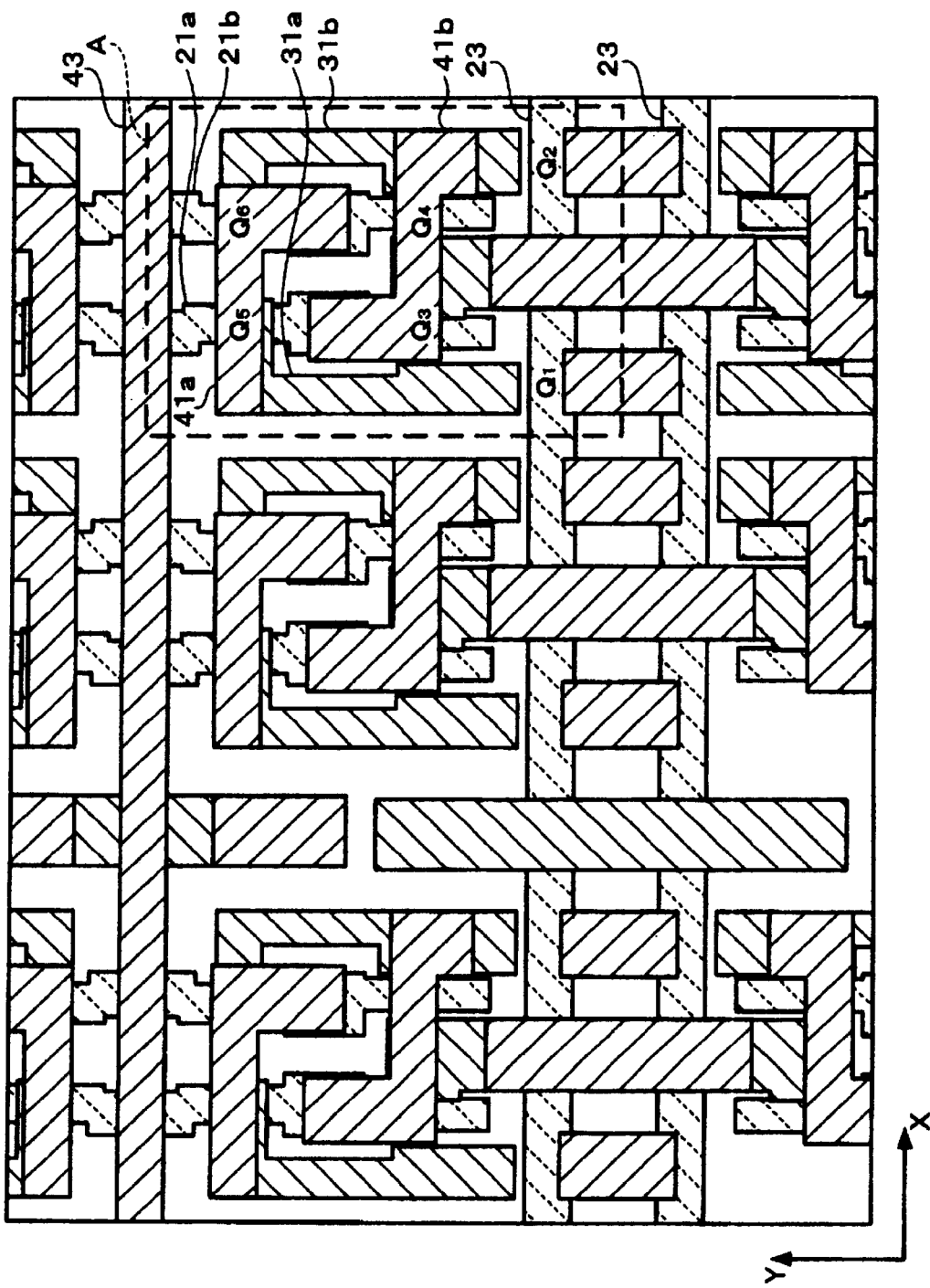
FIG. 1 is a plan view of first, second and third conduction layers in a part of a memory cell array in accordance with one embodiment of the present invention.

FIG. 1 is a plan view of part of a memory cell array in accordance with the present embodiment including first, second and third conduction layers. To facilitate understanding of FIG. 1, the first, second and third layers are individually described first.

Figure 3:
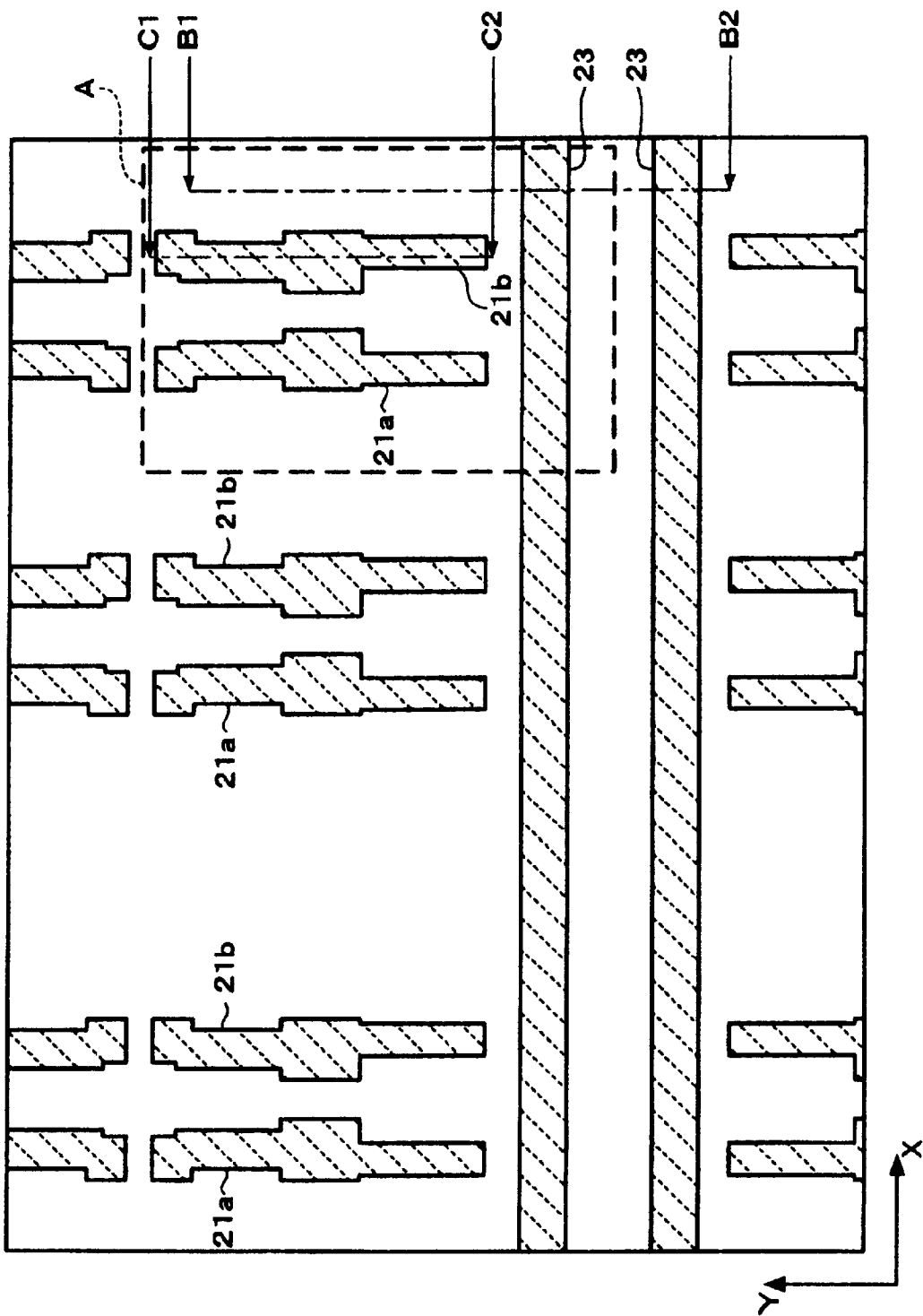
FIG. 3 is a plan view of a first conduction layer in a part of the memory cell array in accordance with one embodiment of the present invention.
Figure 5:
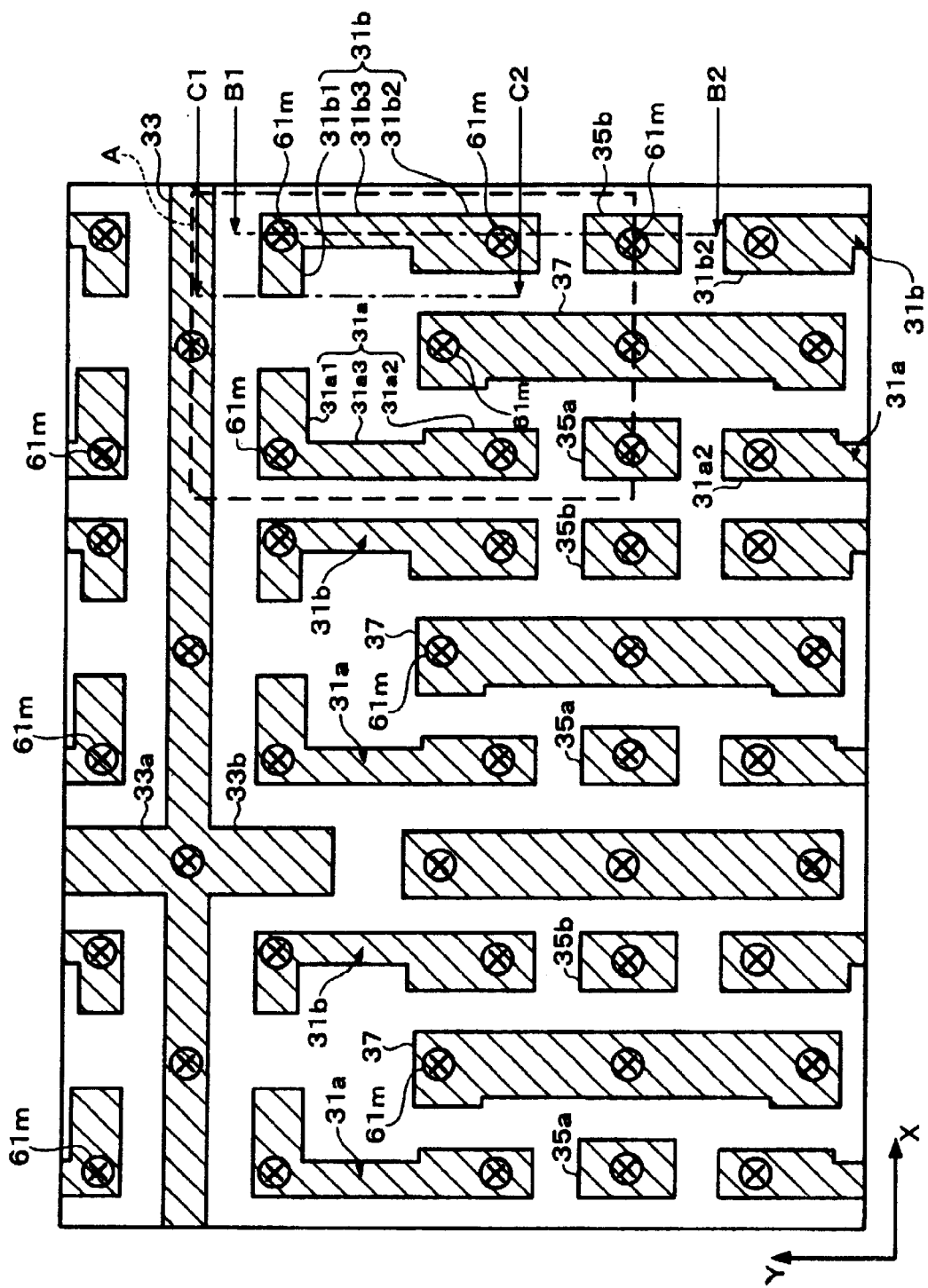
FIG. 5 is a plan view of a second conduction layer in a part of the memory cell array in accordance with one embodiment of the present invention.
Figure 8:
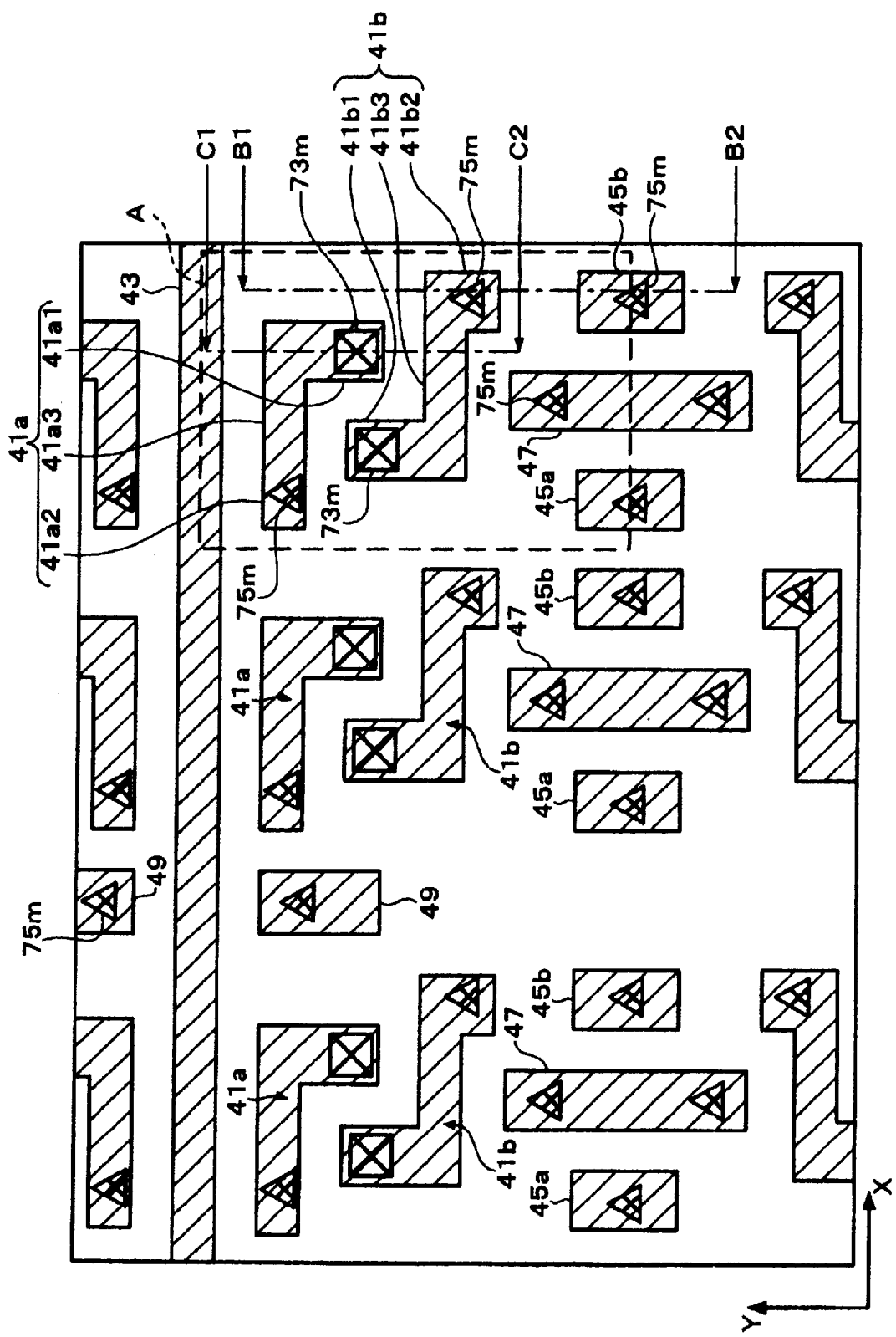
FIG. 8 is a plan view of a third conduction layer in a part of the memory cell array in accordance with one embodiment of the present invention.
Figure 9:
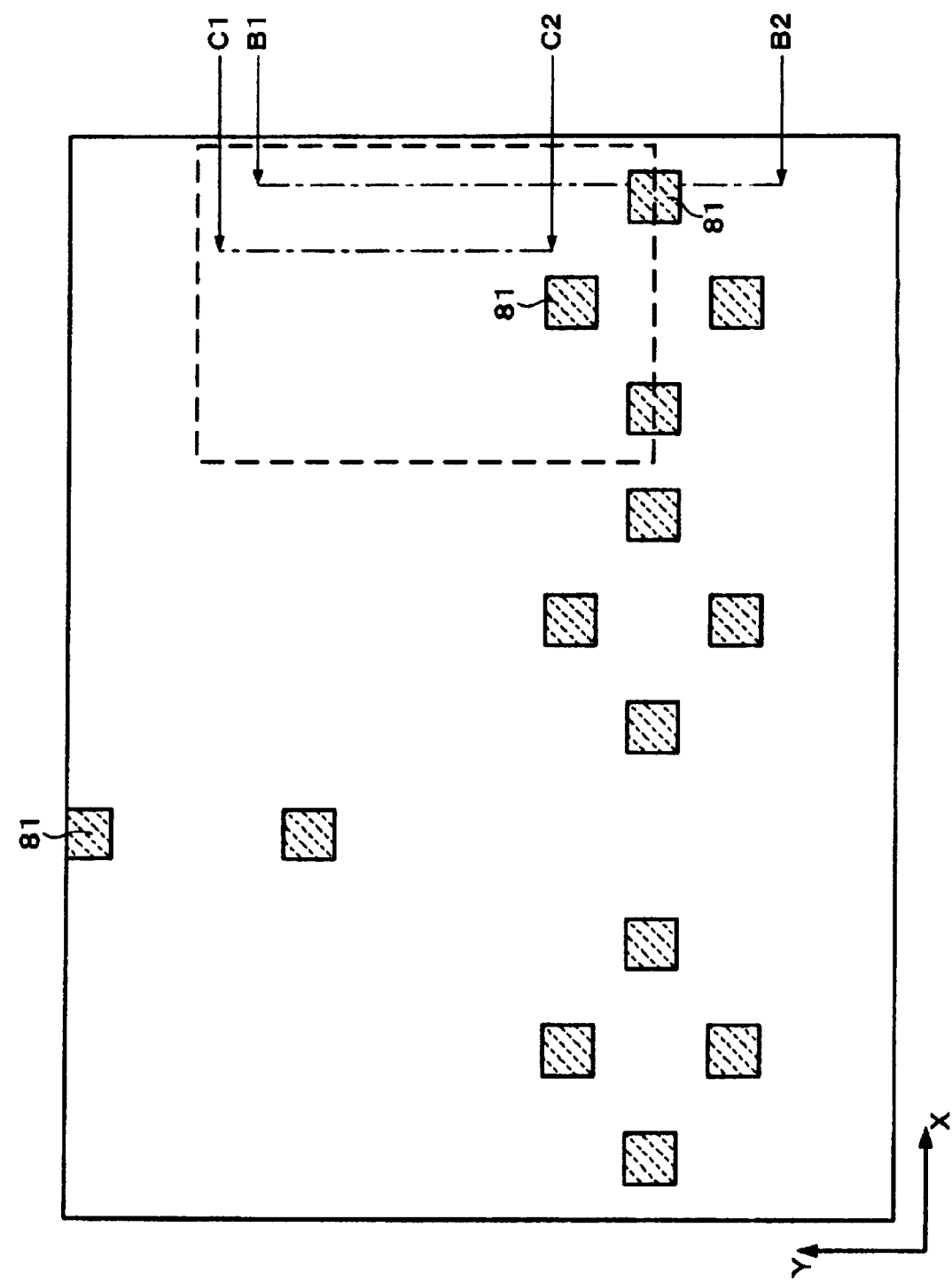
FIG. 9 is a plan view of a plug 81 in a part of the memory cell array in accordance with one embodiment of the present invention.

As shown in FIG. 3, gate electrode layers 21a and 21b and auxiliary word lines 23 are disposed in the first layer. As shown in FIG. 5, drain-drain connection layers 31a and 31b are disposed in the second layer. As shown in FIG. 8, drain-gate connection layers 41a and 41b are disposed in the third layer. A structure shown in FIG. 5 is located above the structure shown in FIG. 3, and a structure shown in FIG. 8 is located above the structure shown in FIG. 5. FIG. 1 shows these structures in one figure.

FIG. 1 shows a portion that forms a flip-flop. This is described focusing on a region A. The region A is a region where one memory cell is formed. The region A in the other figures has the same meaning.

Figure 16:
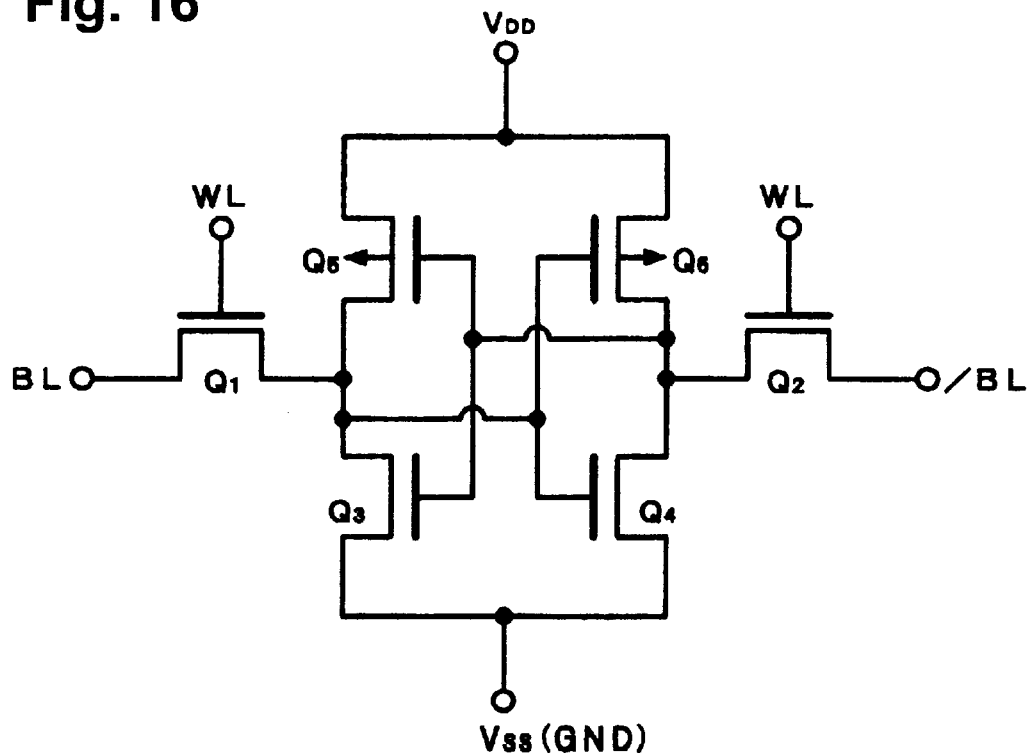
FIG. 16 is an equivalent circuit of an SRAM in accordance with one embodiment of the present invention.

In the region A, six MOS field effect transistors, namely, n-channel type transfer transistors $Q_1$ and $Q_2$, n-channel type driver transistors $Q_3$ and $Q_4$, and p-channel type load transistors $Q_5$ and $Q_6$ are formed. The driver transistor $Q_3$ and the load transistor $Q_5$ form one CMOS inverter. Also, the driver transistor $Q_4$ and the load transistor $Q_6$ form one CMOS inverter. These two CMOS inverters are cross-coupled to form a flip-flop. A circuit that is formed by the six MOS field effect transistors in Region A can be represented by an equivalent circuit shown in FIG. 16.

Referring to FIG. 1 again, the gate electrode layer 21a and the gate electrode layer 21b are formed in linear patterns, respectively. The gate electrode layer 21a forms gate electrodes of the driver transistor $Q_3$ and the load transistor $Q_5$, and also connects these electrodes to one another. Also, the gate electrode layer 21b forms gate electrodes of the driver transistor $Q_4$ and the load transistor $Q_6$, and further connects these electrodes to one another.

A drain of the driver transistor $Q_3$ and a drain of the load transistor $Q_5$ are connected by the drain-drain connection layer 31a. Also, a drain of the driver transistor $Q_4$ and a drain of the load transistor $Q_6$ are connected by the drain-drain connection layer 31b. The drain-drain connection layer 31a and the drain-drain connection layer 31b are in linear patterns, respectively.

Gate electrodes (the gate electrode layer 21a) of the driver transistor $Q_3$ and the load transistor $Q_5$ and the drain-drain connection layer 31b are connected by the drain-gate connection layer 41b. Also, gate electrodes (the gate electrode layer 21b) of the driver transistor $Q_4$ and the load transistor $Q_6$ and the drain-rain connection layer 31a are connected by the drain-gate connection layer 41a. The drain-gate connection layer 41a and the drain-gate connection layer 41b are in letter-L shape patterns, respectively. A first side and a second side of each of the L-letter patterns generally form an angle of 90 degrees. The first side of the drain-gate connection layer 41a is opposed to the first side of the drain-gate connection layer 41b. The second side of the drain-gate connection layer 41a is opposed to the second side of the drain-gate connection layer 41b. The drain-gate connection layer 41a and the drain-gate connection layer 41b are symmetrical about a point.

The gate electrode layer 21a, the gate electrode layer 21b, the drain-drain connection layer 31a and the drain-drain connection layer 31b are disposed in parallel with one another. When viewed in plan view, the gate electrode layers 21a and 21b are located between the drain-drain connection layer 31a and the drain-drain connection layer 31b.

{Structure of Memory Cell}

Figure 2:
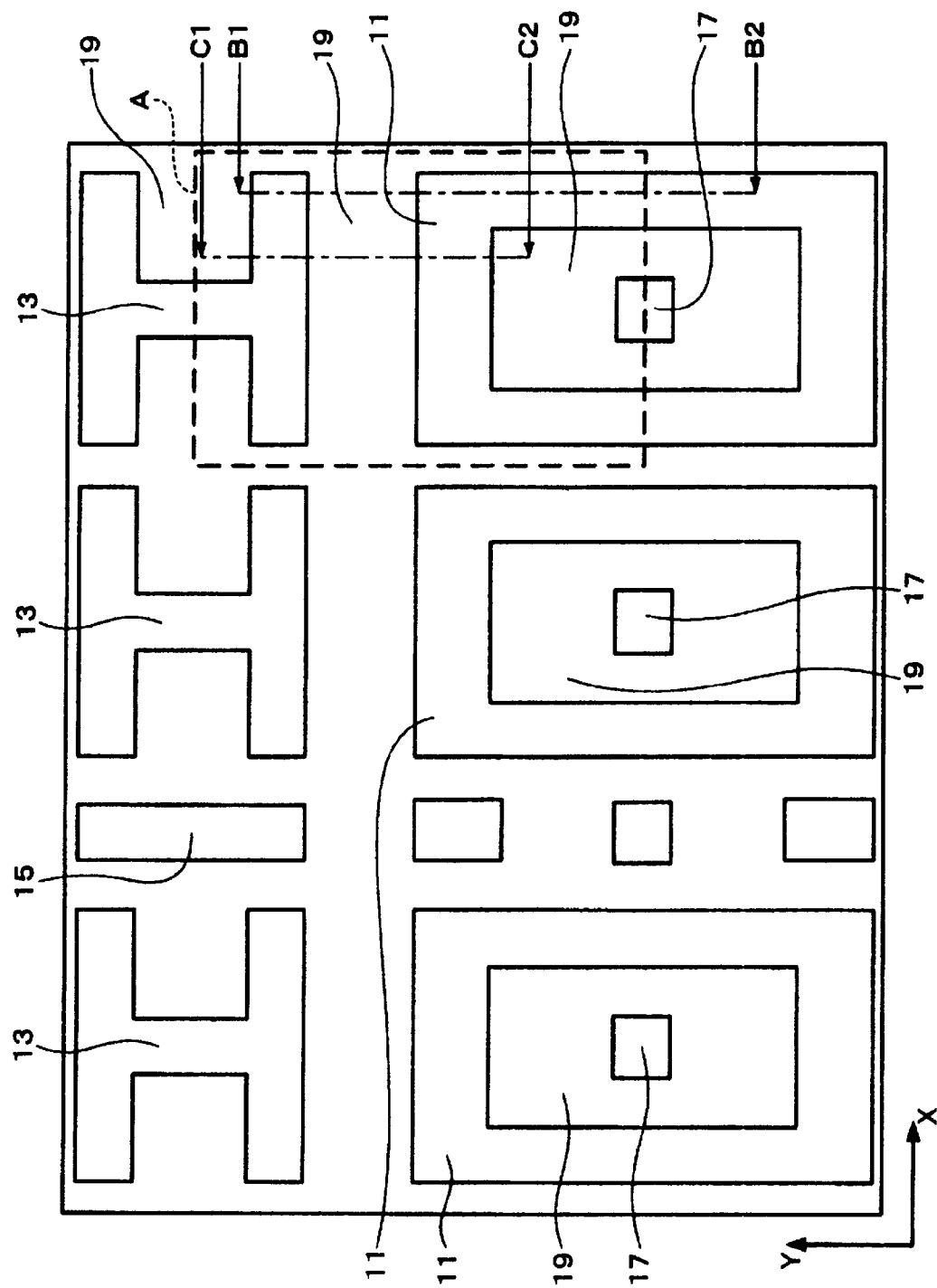
FIG. 2 is a plan view of a field in a part of the memory cell array in accordance with one embodiment of the present invention.
Figure 10:
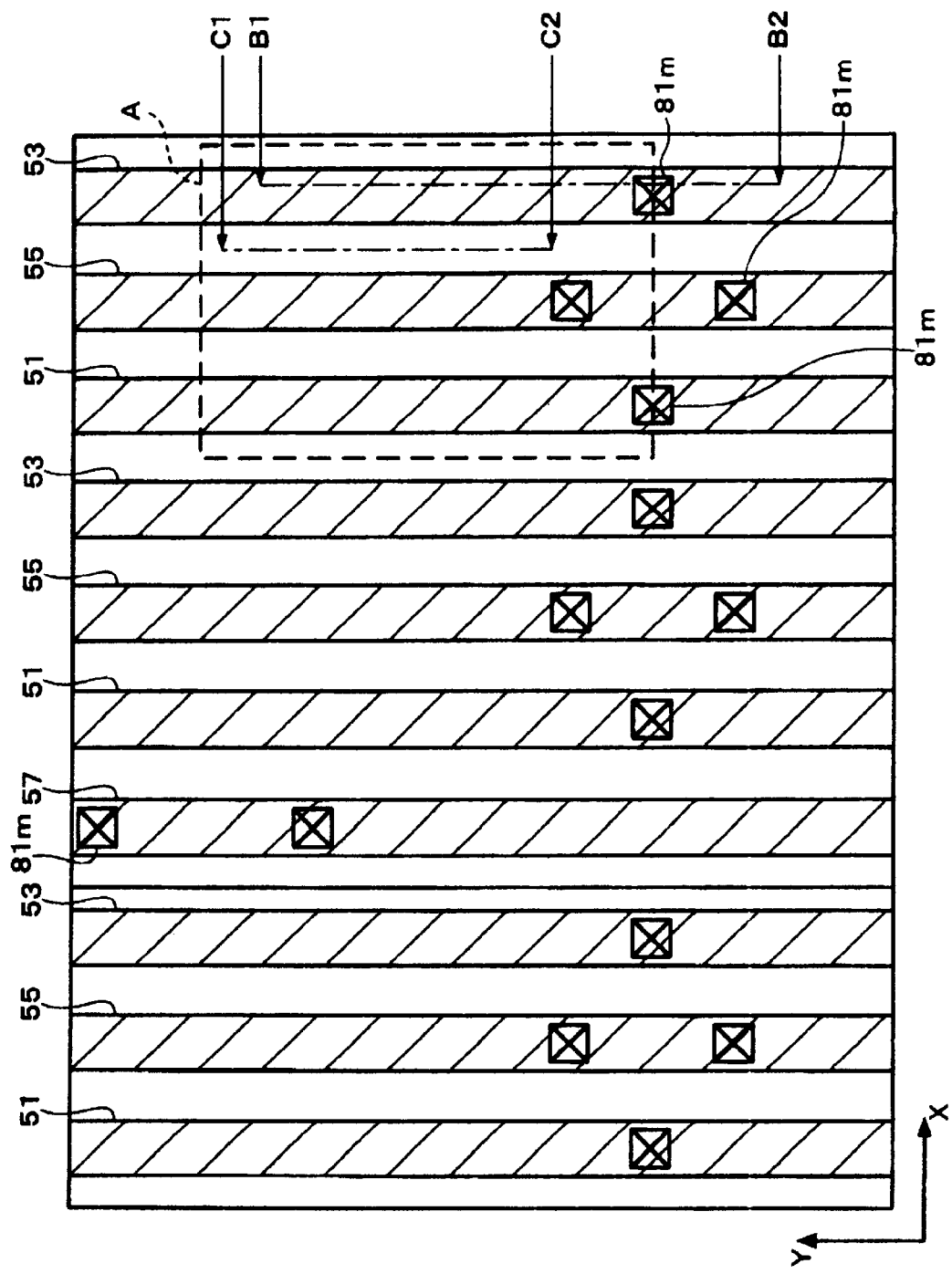
FIG. 10 is a plan view of a fourth conduction layer in a part of the memory cell array in accordance with one embodiment of the present invention.

Next, a structure of the memory cell in accordance with the present embodiment is described. The memory cell of the present embodiment has a structure in which first, second, third and fourth conduction layers are successively stacked in layers over a field with interlayer dielectric layers interposed between the layers. As shown in FIG. 2, the field is a region where active regions 11, 13, 15 and 17, and element isolation regions 19 are located. The fourth layer is a layer where bit lines 51 and the like are located, as shown in FIG. 10. The memory cell of the present embodiment has a structure in which the first, second and third conduction layers described above with reference to FIG. 1 are positioned over the field shown in FIG. 2, and the fourth conduction layer shown in FIG. 10 is positioned over these layers.

Detailed Structure of the Embodiment

Figure 12:
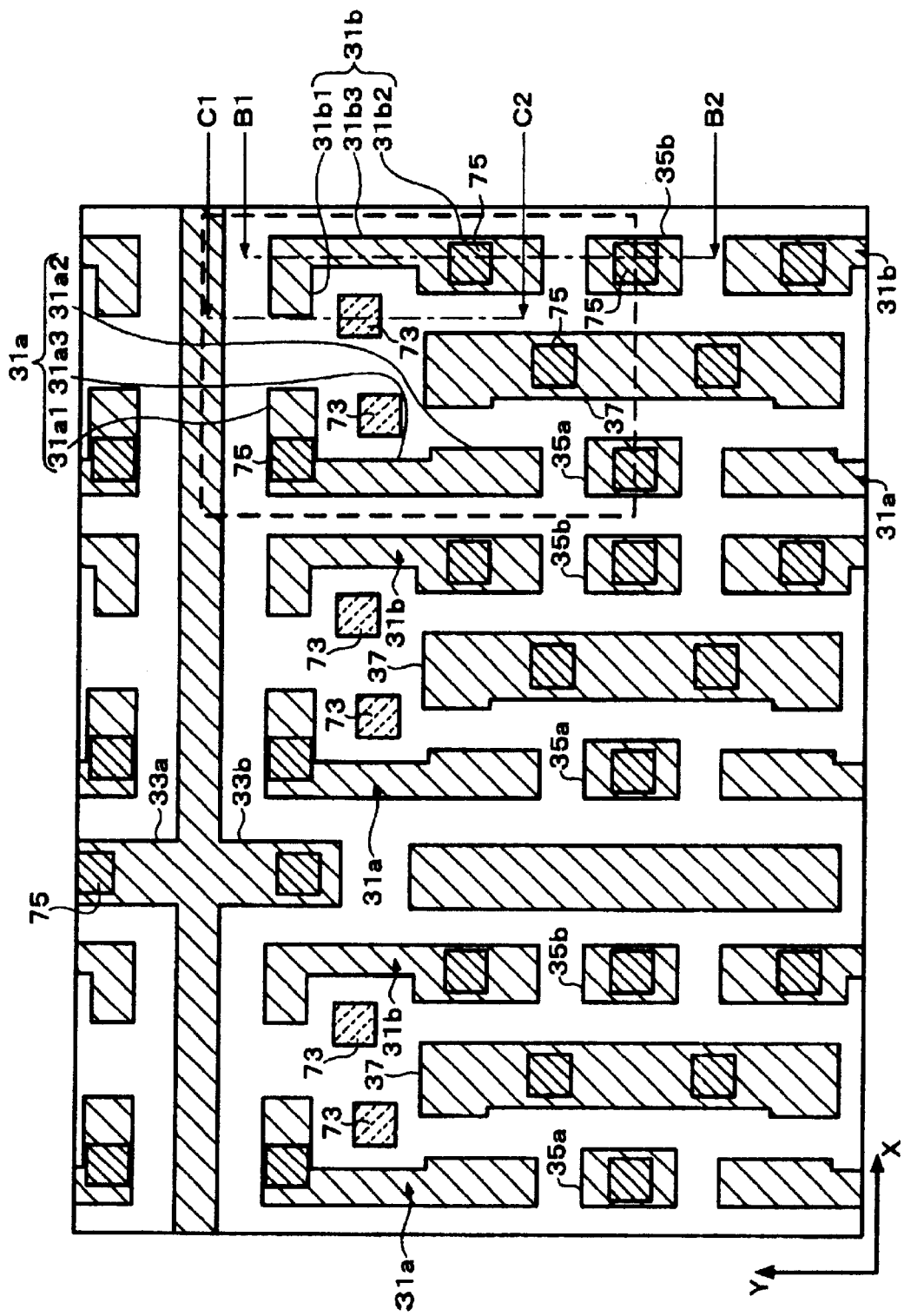
FIG. 12 is a plan view of the second layer and the plugs 73 and 75 in accordance with one embodiment of the present invention.
Figure 13:
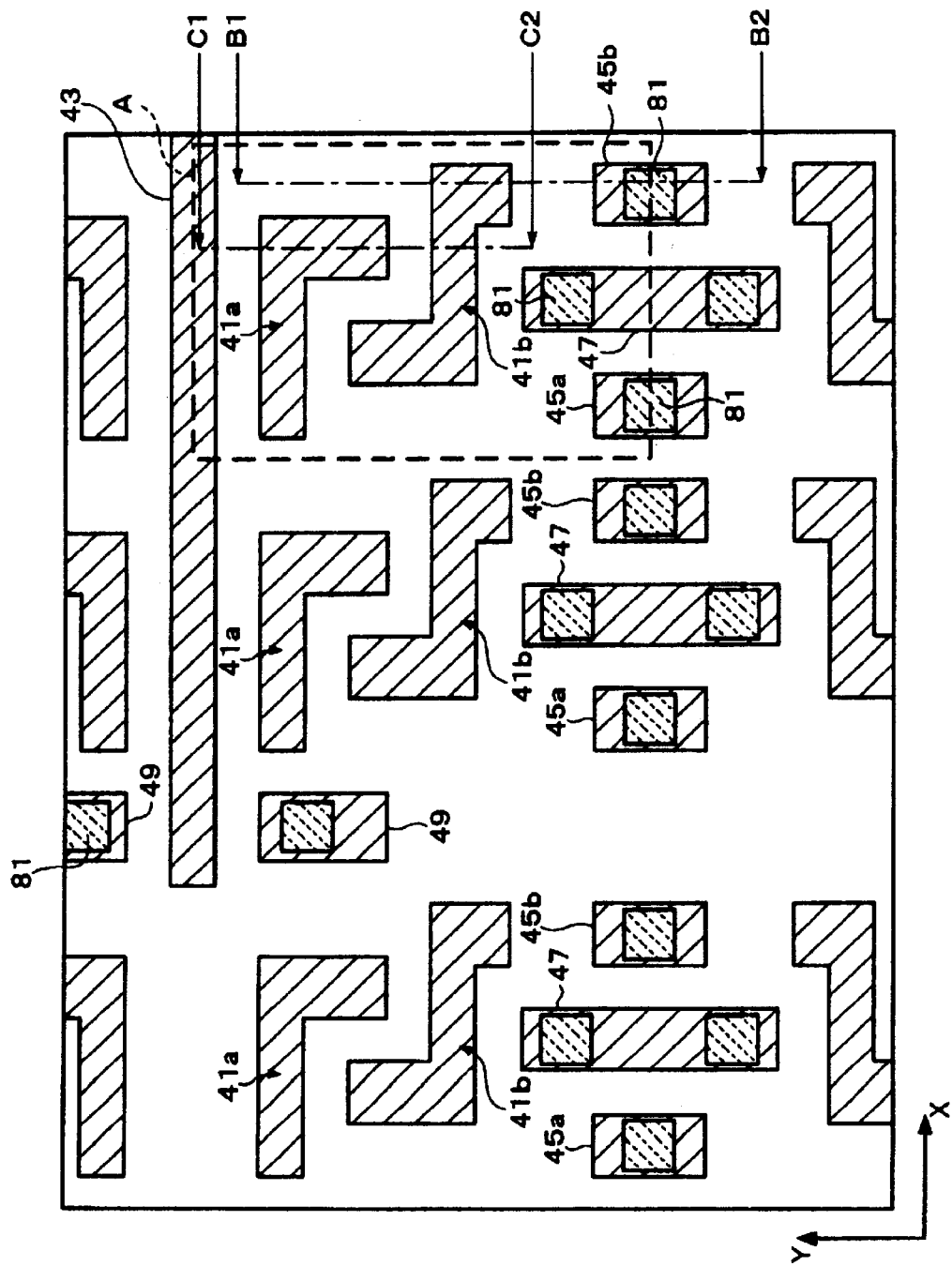
FIG. 13 is a plan view of the third layer and the plug 81 in accordance with one embodiment of the present invention.
Figure 14:
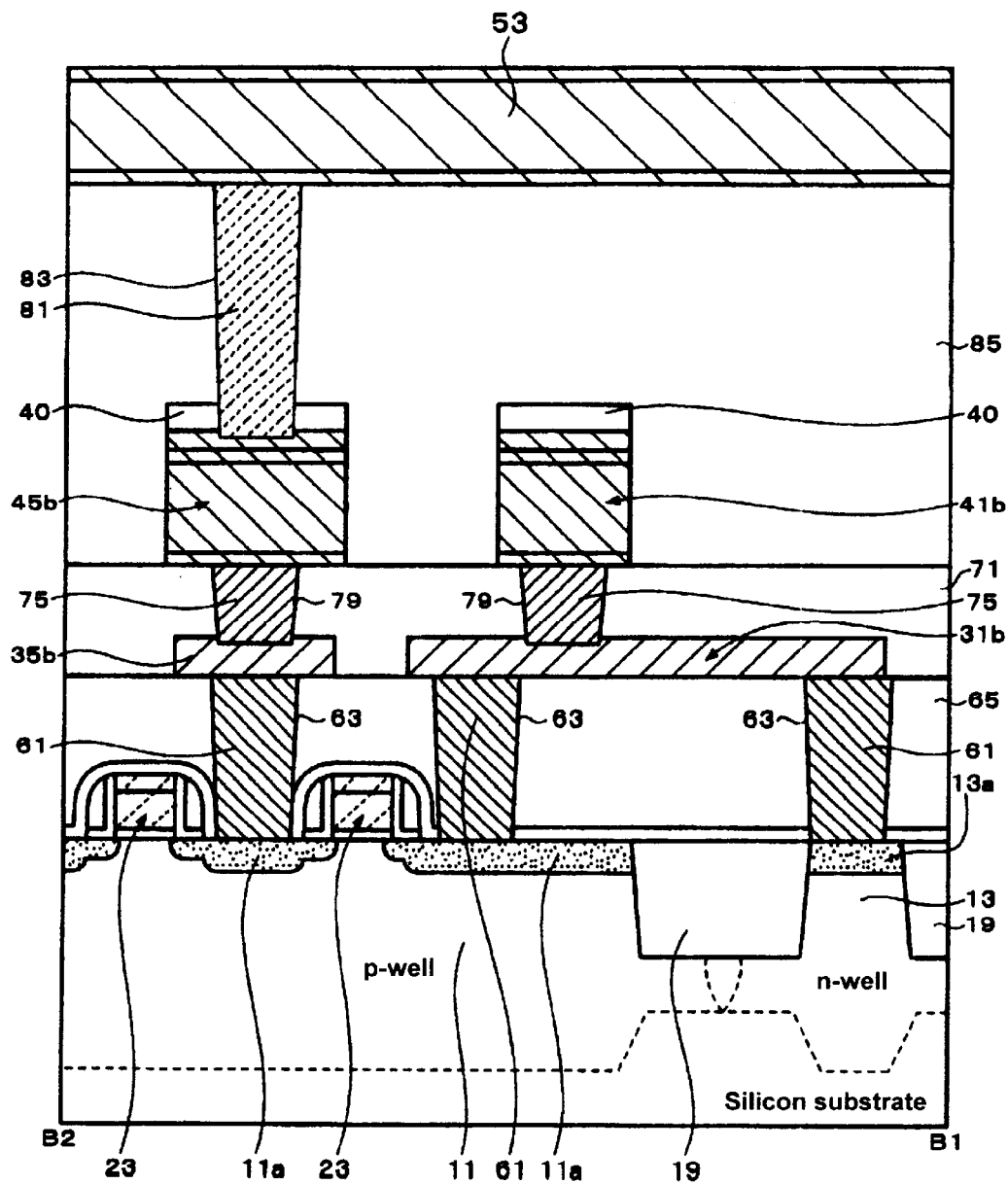
FIG. 14 is a cross-sectional view taken along lines B1–B2 shown in a plan view in accordance with one embodiment of the present invention.
Figure 15:
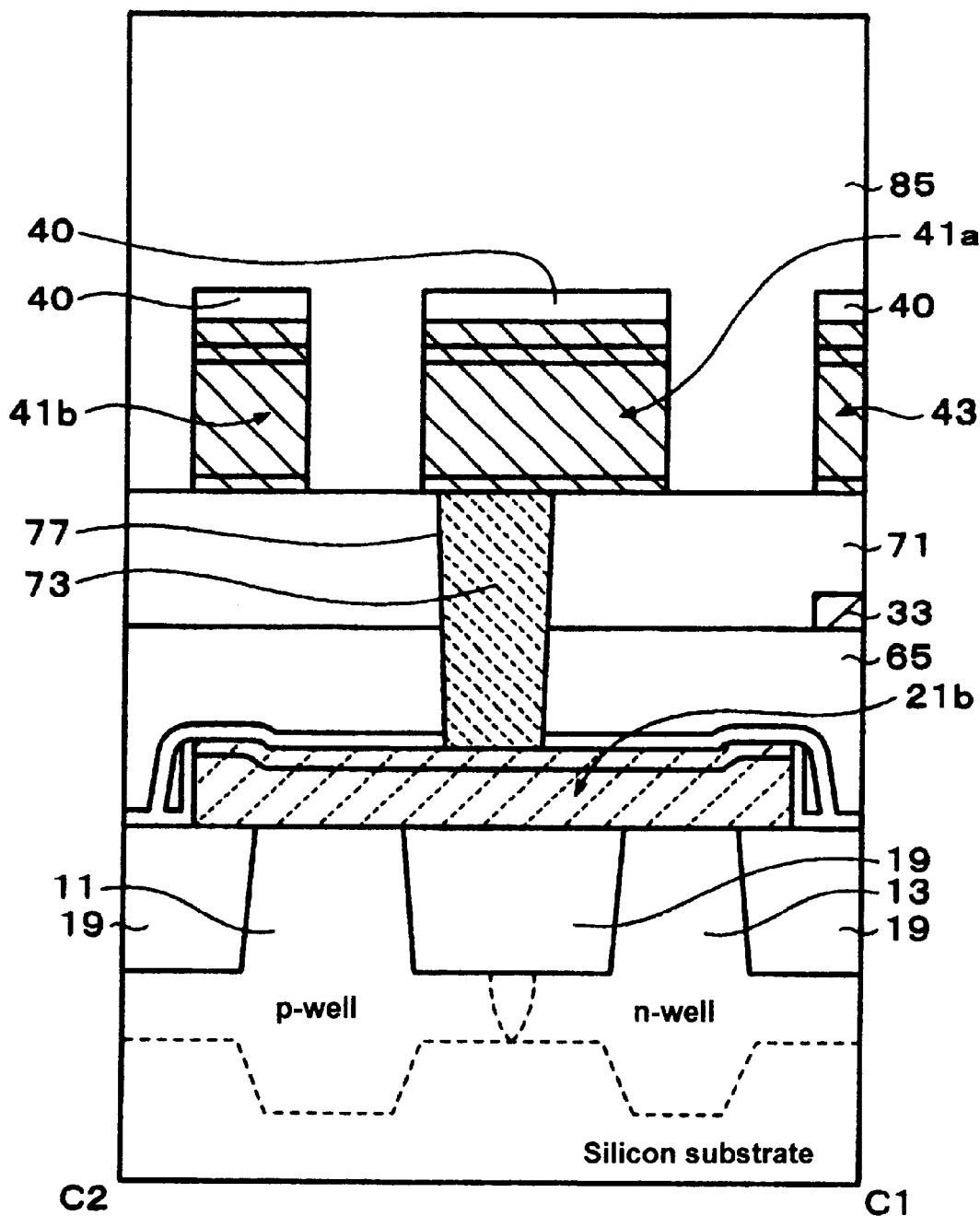
FIG. 15 is a cross-sectional view taken along lines C1–C2 shown in a plan view in accordance with one embodiment of the present invention.

The structure of the present embodiment is described in detail from the perspective of the bottom layer with reference to FIGS. 2–15. FIGS. 2–13 show plane B1–B2, and plane C1–C2. FIG. 14 is a cross-sectional view taken along the plane B1–B2, and FIG. 15 is a cross-sectional view taken along the plane C1–C2.

{Field, First Layer}

Figure 11:
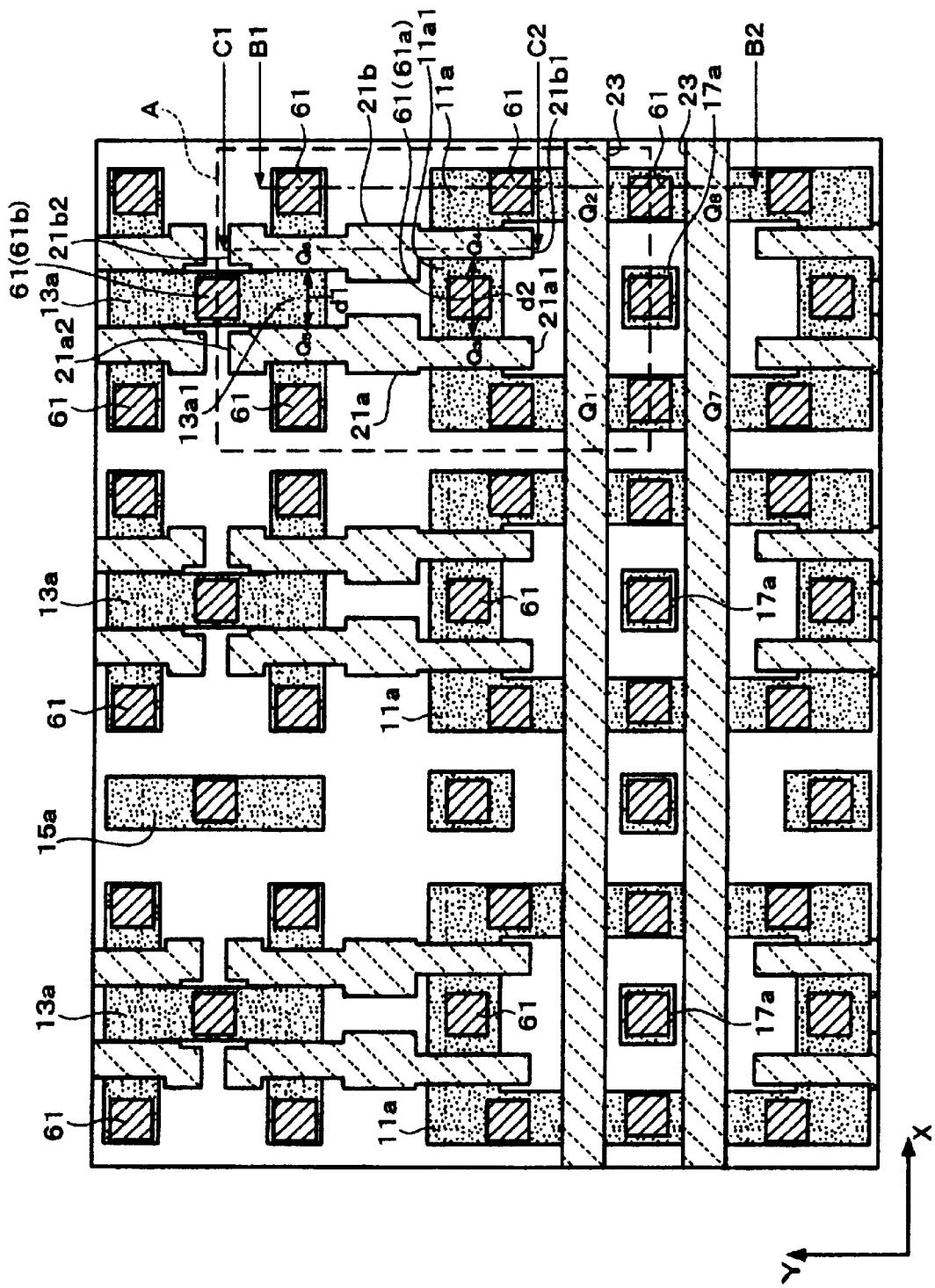
FIG. 11 is a plan view of the field, the first layer and the plug 61 in accordance with one embodiment of the present invention.

FIG. 11 is a plan view of the field and the first conduction layer. First, the field is described with reference to FIGS. 2, 14 and 15. FIG. 2 is a plan view of the field. The field includes active regions 11, 13, 15 and 17, and element isolation regions 19. The active regions 11, 13, 15 and 17 are formed on the surface of a silicon substrate.

The active region 11 has a generally rectangular frame shape. A plurality of the active regions 11 are arranged in the X-axis direction in FIG. 2. The transfer transistors $Q_1$ and $Q_2$ and the driver transistors $Q_3$ and $Q_4$ shown in FIG. 1 are formed in the active region 11.

The active region 13 generally is in a letter-H shape. A plurality of the active regions 13 are arranged in the X-axis direction in FIG. 2. The load transistors $Q_5$ and $Q_6$ shown in FIG. 1 are formed in the active region 13.

Each one of the active regions 15 is formed, for example, for every thirty-two (32) memory cells arranged in the X-axis direction. A well contact region for n-wells is formed in the active region 15. Accordingly, the n-wells corresponding to the thirty-two (32) memory cells are connected to a $V_{DD}$ wiring (power supply line) through the well contact region.

Each one of the active regions 17 is formed, for example, for every two memory cells arranged in the Y-axis direction. A well contact region for p-wells is formed in the active region 17. Accordingly, the p-wells corresponding to the two memory cells is connected to a $V_{SS}$ wiring (grounding line) through the well contact region.

The active regions 11, 13, 15 and 17 are isolated from other active regions by the element isolation regions 19 (having a depth of, for example, 400 nm). The element isolation regions 19 may be provided by, for example, STI(shallow trench isolation).

Cross-sectional views of the field shown in FIG. 2 taken along the plane B1–B2 and the plane C1–C2 are shown in FIG. 14 and FIG. 15, respectively. The active regions 11 and 13 and the element isolation regions 19 appear in these cross sections.

Next, the first layer positioned on the field is described with reference to FIG. 3, FIG. 11, FIG. 14 and FIG. 15. FIG. 3 is a plan view of the first conduction layer. A plurality of gate electrode layers 21a and 21b and a plurality of auxiliary word lines 23 are disposed in the first layer. The gate electrode layers 21a and 21b and the auxiliary word lines 23 have a structure in which, for example, a silicide layer is formed on a polysilicon layer.

Each of the gate electrode layers 21a and 21b has a linear pattern extending in the Y-axis direction in FIG. 3. One pair of the gate electrode layers 21a and 21b is disposed in parallel with each other in each one memory cell region. The gate electrode layers 21a and 21b become gate electrodes of the driver transistors $Q_3$ and $Q_4$ and the load transistors $Q_5$ and $Q_6$ shown in FIG. 1. The gate length of each of the driver transistors $Q_3$ and $Q_4$ is, for example, 0.18 $\mu$m, and the gate length of each of the load transistors $Q_5$ and $Q_6$ shown is, for example, 0.20 $\mu$m.

Each of the auxiliary word lines 23 has a linear pattern extending in the X-axis direction in FIG. 3. The auxiliary word lines 23 are located on the side of the driver transistors. The auxiliary word lines 23 are activated or inactivated by main word lines located in an upper layer. The auxiliary word lines 23 become gate electrodes of the transfer transistors. The gate length of each of transfer transistors is, for example, 0.24 $\mu$m.

Next, source/drain regions and the like that are formed in the active regions are described. As shown in FIG. 11, n$^+$ type source/drain regions 11a are formed in the active regions 11. The "source/drain region" means a region that functions as at least one of a source and a drain. For example, source regions of the driver transistors $Q_3$ and $Q_4$ among the n$^+$ type source/drain regions 11a are n$^+$ type source regions 11a1. P$^+$ type source/drain regions 13a are formed in the active regions 13. For example, source regions of the load transistors $Q_5$ and $Q_6$ among the p$^+$ type source/drain regions 13a are p$^+$ type source regions 13a1. N$^+$ type well contact regions 15a are formed in the active regions 15. P$^+$ type well contact regions 17a are formed in the active regions 17.

Figure 4:
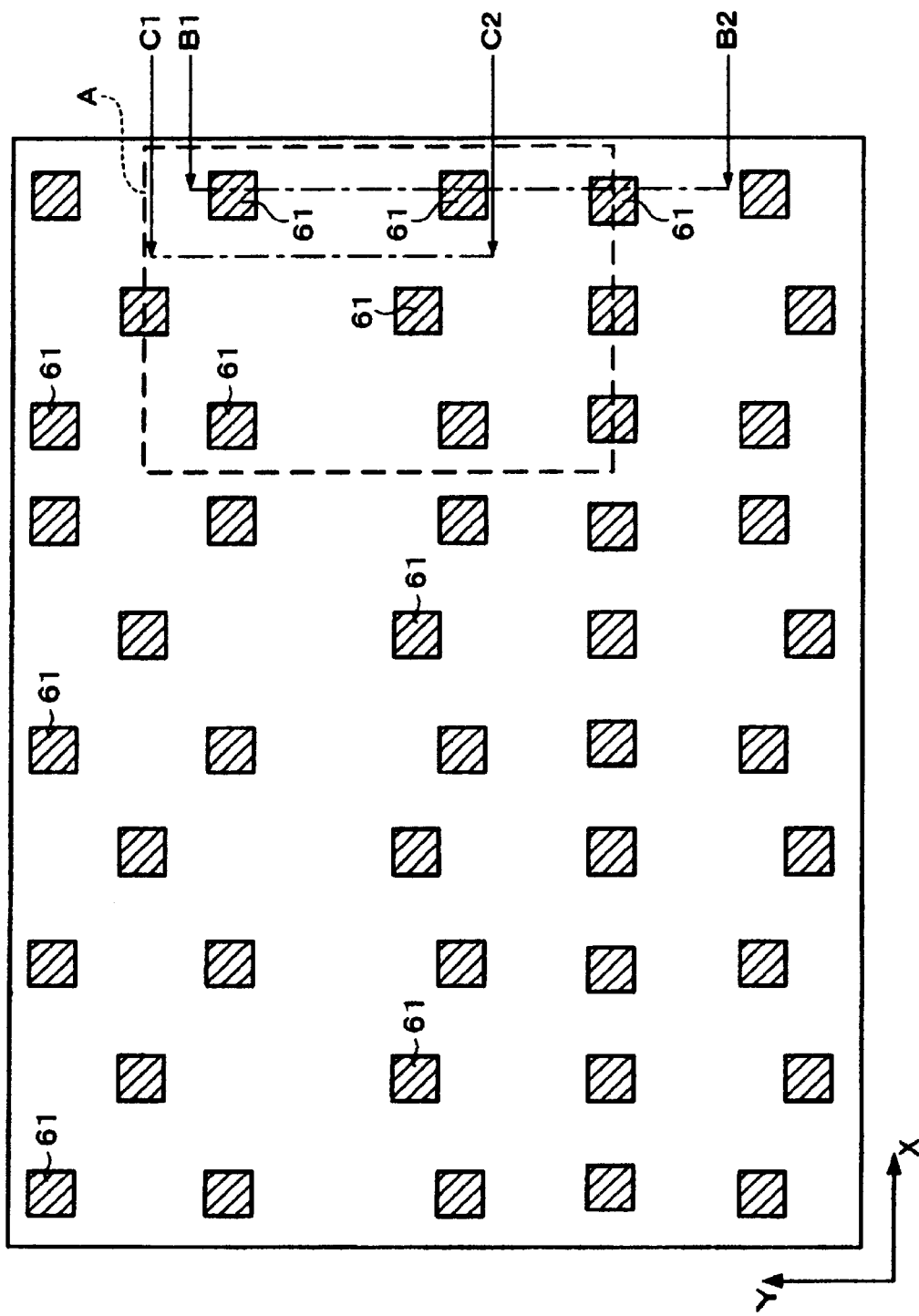
FIG. 4 is a plan view of a plug 61 in a part of the memory cell array in accordance with one embodiment of the present invention.

An interlayer dielectric layer, such as, for example, a silicon oxide layer (not shown in FIG. 11) is formed in a manner to cover the field and the first layer. As shown in FIG. 14 and FIG. 15, the interlayer dielectric layer 65 is processed by CMP for planarization. A plurality of contact holes 63 are formed in the interlayer dielectric layer 65, which expose the n⁺ type source/drain regions 11a and the like. Plugs 61 are embedded in the contact holes 63. The plugs 61 are connected to the n⁺ type source/drain regions 11a, the p⁺ type source/drain regions 13a, the n⁺ type well contact regions 15a, and the p⁺ type well contact regions 17a. The plugs 61 have patterns as shown in FIG. 4 in plan view. Tungsten, for example, can be used as a material for the plugs 61. The diameter of the contact hole 63 at its upper end section is, for example, 0.30 μm, and at its lower end section is, for example, 0.24 μm.

{Second Layer}

The second layer is structurally located above the structure shown in FIG. 11. As shown in FIG. 5, a plurality of drain-drain connection layers 31a and 31b, $V_{DD}$ wiring 33, a plurality of BL (bit line) contact pad layers 35a and 35b, and a plurality of $V_{SS}$ local wirings 37 are disposed in the second conduction layer. They have a structure in which, for example, a titanium nitride layer (having a thickness of, for example, 135 nm) is formed on an underlying titanium layer (having a thickness of, for example, 8.5 nm).

The drain-drain connection layers 31a and 31b have linear patterns extending in the Y-axis direction, respectively, as shown in FIG. 5. A main body section 31a3 of the drain-drain connection layer 31a has a width smaller than a width of either of the end sections 31a1 and 31a2 of the drain-drain connection layer 31a. Similarly, a main body section 31b3 of the drain-drain connection layer 31b has a width smaller than a width of either of the end sections 31b1 and 31b2 of the drain-drain connection layer 31b. The width of each of the main body section 31a3 and the main body section 31b3 is a minimum value on the design rule. One set of the drain-drain connection layers 31a and 31b are disposed in every one memory cell region. As shown in FIG. 1, as viewed in plan view, one set of the gate electrode layers 21a and 21b are located between the drain-drain connection layer 31a and the drain-drain connection layer 31b.

The $V_{SS}$ local wiring 37 has a linear pattern extending in the Y-axis direction in FIG. 5. The width of end sections of the $V_{SS}$ local wiring 37 is greater than a width of a main body section of the $V_{SS}$ local wiring 37. The $V_{SS}$ local wiring 37 is located between the end section 31a2 of the drain-drain connection layer 31a and the end section 31b2 of the drain-drain connection layer 31b. From this point, the $V_{SS}$ local wiring 37 extends to an area between the end section 31a2 of the drain-drain connection layer 31a and the end section 31b2 of the drain-drain connection layer 31b of a memory cell located therebelow in FIG. 5. Each one of the $V_{SS}$ local wirings 37 is disposed for every two of the memory cells.

The BL contact pad layer 35a functions as a pad layer to connect the bit line and the n⁺ type source/drain region 11a (see FIG. 11). Similarly, the BL contact pad layer 35b functions as a pad layer to connect the bit line and the n⁺ type source/drain region 11a.

The BL contact pad layer 35a is located between the drain-drain connection layer 31a of one memory cell and the drain-drain connection layer 31a of another memory cell located below in FIG. 5. Similarly, the BL contact pad layer 35b is located between the drain-drain connection layer 31b of one memory cell and the drain-drain connection layer 31b of another memory cell located therebelow in FIG. 5. Each one of the BL contact pad layers 35a and 35b is disposed for every two memory cells.

The $V_{DD}$ wiring 33 has a linear pattern extending in the X-axis direction in FIG. 5. The $V_{DD}$ wiring 33 extends three-dimensionally across the n⁺ type well contact region 15a (see FIG. 11). The $V_{DD}$ wiring 33 has branch sections 33a and 33b above the n⁺ type well contact region 15a.

The drain-drain connection layers 31a and 31b, the $V_{DD}$ wiring 33, the BL contact pad layers 35a and 35b, and the $V_{SS}$ local wirings 37 located in the second layer shown in FIG. 5 are connected to the plugs 61 shown in FIG. 11. These connected sections are shown in FIG. 5 as contact sections 61m.

FIG. 14 is a cross-sectional view of the second layer shown in FIG. 5 taken along plane B1–B2. The drain-drain connection layer 31b and the BL contact pad layer 35b appear in the cross-sectional view.

An interlayer dielectric layer, such as, for example, a silicon oxide layer (not shown in FIG. 5) is formed in a manner to cover the second layer. As shown in FIG. 14 and FIG. 15, the interlayer dielectric layer 71 is processed by CMP for planarization. A plurality of through holes 79 are formed in the interlayer dielectric layer 71, which expose the drain-drain connection layer 31b and the like, as shown in FIG. 14. Plugs 75 are embedded in the through holes 79. Also, as shown in FIG. 15, through holes 77 are formed in the interlayer dielectric layers 71 and 65, which expose the gate electrode layers 21b. Plugs 73 are embedded in the through holes 77. FIG. 12 is a plan view of the relationships between the plugs 73 and 75 and the second conduction layer.

Figure 6:
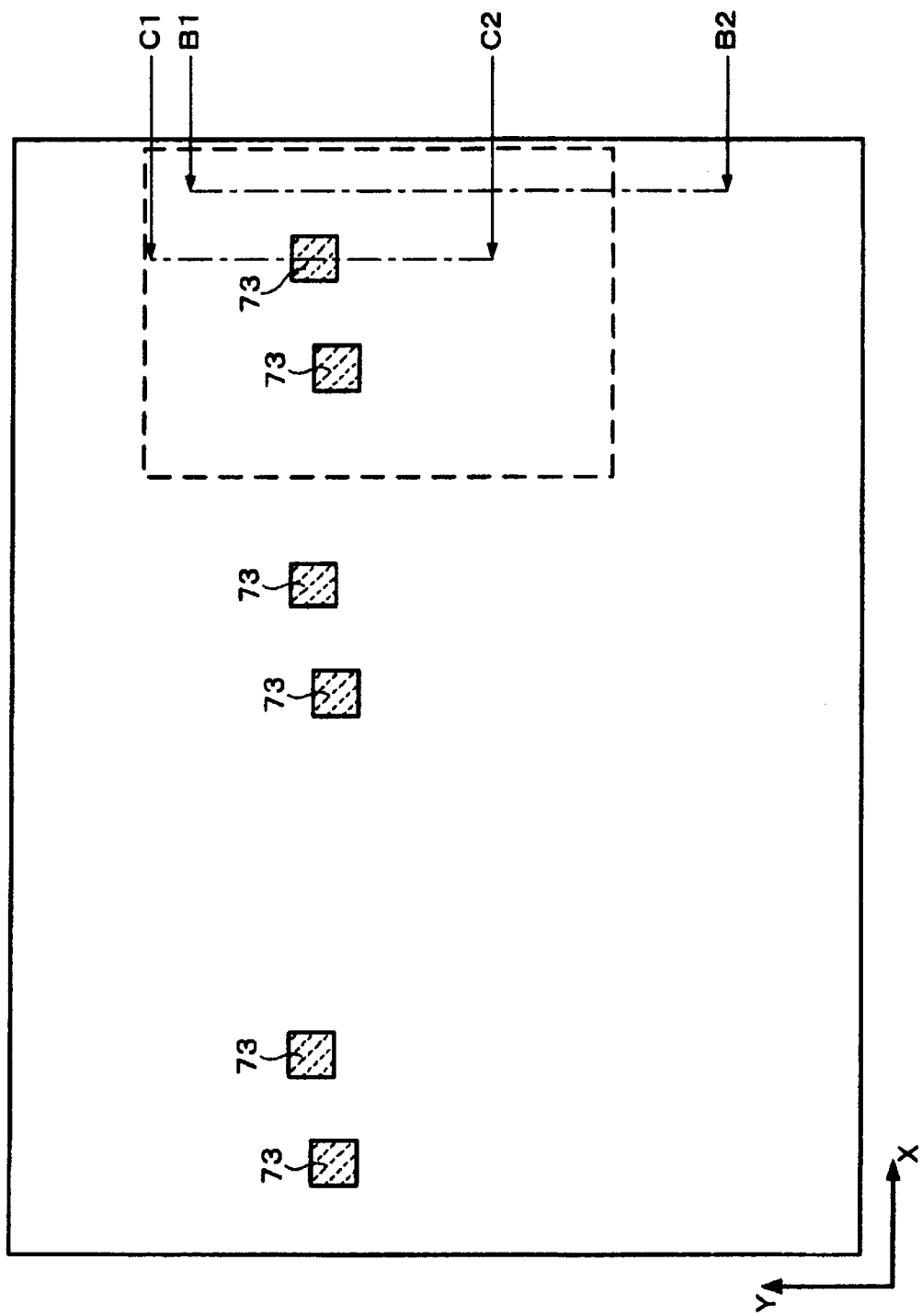
FIG. 6 is a plan view of a plug 73 in a part of the memory cell array in accordance with one embodiment of the present invention.

The plugs 73 are described below. The plugs 73 are disposed in plan view as shown in FIG. 6. The plugs 73 are connected to the gate electrode layers 21a and 21b (see FIG. 3). FIG. 15 is a cross-sectional view of the plug 73 and is described below. The plug 73 is embedded in the through hole 77 that passes through the two interlayer dielectric layers 65 and 71. The plug 73 is connected to the gate electrode layer 21b as shown in this cross-sectional view. Tungsten, for example, can be used as a material of the plugs 73. The diameter of the through hole 77 at its upper end section is, for example, 0.32 μm, and at its lower end section is, for example, 0.24 μm.

Figure 7:
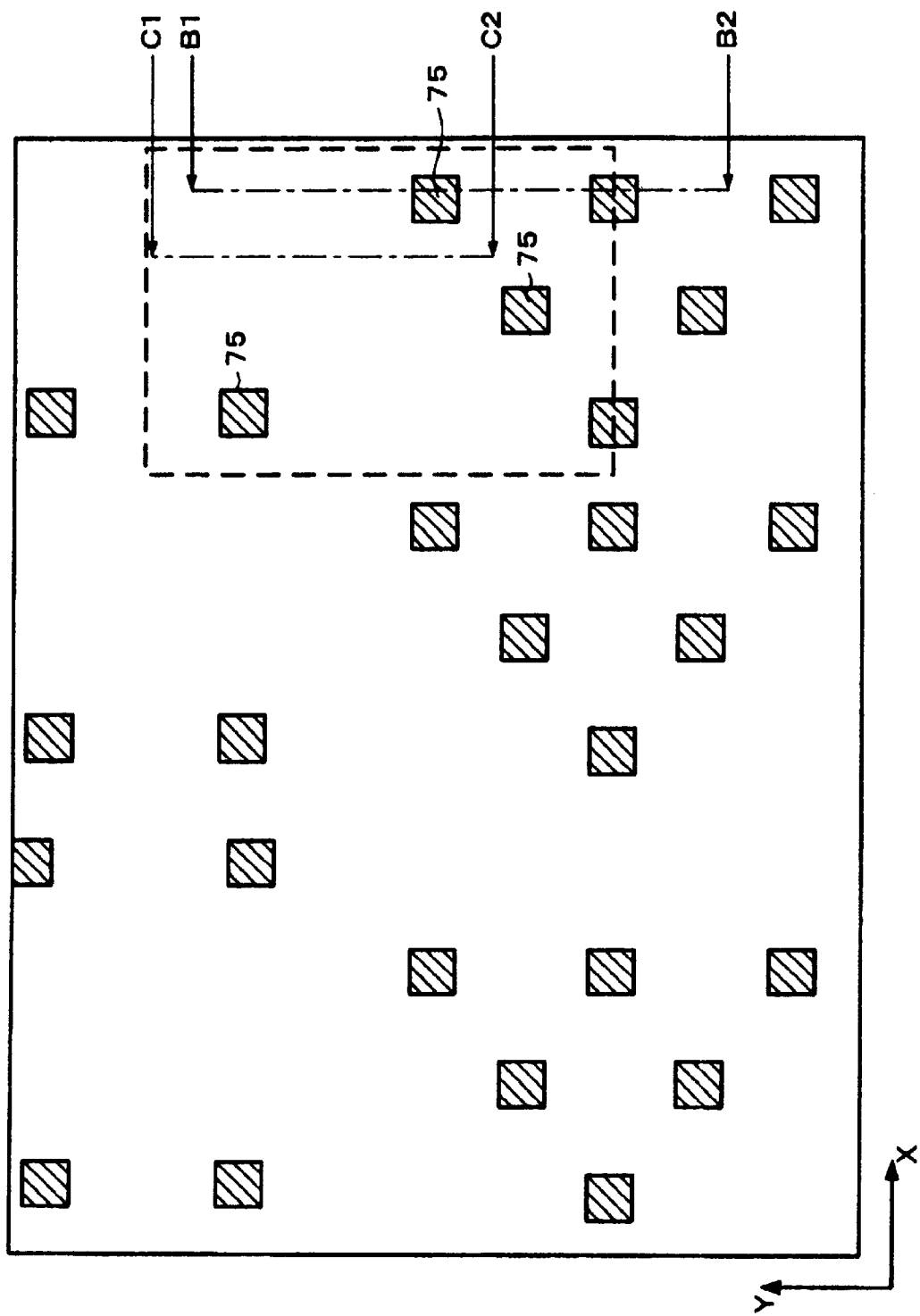
FIG. 7 is a plan view of a plug 75 in a part of the memory cell array in accordance with one embodiment of the present invention.

The plugs 75 are described below. The plugs 75 are disposed in plan view as shown in FIG. 7. The plugs 75 are connected to the drain-drain connection layers 31a and 31b, the branch sections 33a and 33b of the $V_{DD}$ wiring 33, the BL contact pad layers 35a and 35b, and the $V_{SS}$ local wirings 37. FIG. 14 is a cross-sectional view of the plug 75 and is described below. The plug 75 is embedded in the through hole 79 that passes through the interlayer dielectric layer 71. The plug 75 is connected to the drain-drain connection layer 31b and the BL contact pad layer 35b as shown in this cross-sectional view. Tungsten, for example, can be used as a material of the plugs 75. The diameter of the through hole 79 at its upper end section is, for example, 0.30 μm, and at its lower end section is, for example, 0.24 μm.

{Third Layer}

The third layer is structurally located above the structure shown in FIG. 12. As shown in FIG. 8, a plurality of drain-gate connection layers 41a and 41b, main word lines 43, a plurality of BL contact pad layers 45a and 45b, a plurality of $V_{SS}$ contact pad layers 47, and a plurality of $V_{DD}$ contact pad layers 49 are disposed in the third conduction layer. They have a structure in which, for example, from the bottom layer, a titanium nitride layer, an aluminum-copper alloy layer, a titanium layer and a titanium nitride layer are successively stacked in layers.

The drain-gate connection layer 41a has a main body section 41a3 and two end sections 41a1 and 41a2. The main body section 41a3 is a section that extends in the X-axis direction in FIG. 8. The end section 41a1 is a section that bends toward the side of the drain-gate connection layer 41b. Similarly, the drain-gate connection layer 41b has a main body section 41b3 and two end sections 41b1 and 41b2. The main body section 41b3 is a section that extends in the X-axis direction in FIG. 8. The end section 41b1 is a section that bends toward the side of the drain-gate connection layer 41a. One set of the drain-gate connection layers 41a and 41b are disposed in each one of the memory cell regions.

The BL contact pad layer 45a functions as a pad layer to connect the bit line and the n$^+$ type source/drain region 11a. Similarly, the BL contact pad layer 45b functions as a pad layer to connect the bit line and the n$^+$ type source/drain region 11a. Each of the BL contact pad layers 45a and 45b is disposed for every two memory cells.

The $V_{SS}$ contact pad layer 47 extends in the Y-axis direction in FIG. 8 and has two end sections. The Vss contact pad layer 47 is located between the BL contact pad layer 45a and the BL contact pad layer 45b. Each one of the $V_{SS}$ contact pad layers 47 is disposed for every two of the memory cells.

The main word line 43 linearly extends in the X-axis direction in FIG. 8. The main word line 43 is located above the $V_{DD}$ wiring 33 shown in FIG. 5. The $V_{DD}$ contact pad layers 49 are located above the branch sections 33a and 33b of the $V_{DD}$ wiring 33 shown in FIG. 5.

The end section 41a1 of the drain-gate connection layer 41a and the end section 41b1 of the drain-gate connection layer 41b are connected to the plugs 73 shown in FIG. 12, respectively. These connected sections are shown in FIG. 8 as contact sections 73m. The end section 41a2 of the drain-gate connection layer 41a, the end section 41b2 of the drain-gate connection layer 41b, the BL contact pad layers 45a and 45b, the $V_{SS}$ contact pad layer 47 and the $V_{DD}$ contact pad layer 49 are connected to the plugs 75 shown in FIG. 12. These connected sections are shown in FIG. 8 as contact sections 75m.

FIGS. 14 and 15 are cross-sectional views of the third layer shown in FIG. 3 taken along plane B1–B2 and plane C1–C2, respectively. The drain-gate connection layers 41a and 41b, the BL contact pad layer 45b and the main word line 43 appear in these cross-sectional views. A hard mask layer 40 formed of a silicon oxide layer is formed on the third conduction layer including these layers. The third conduction layer is patterned using the hard mask layer 40. This is performed because it is difficult to pattern the third conduction layer using a resist as a mask due to the miniaturized memory cell.

An interlayer dielectric layer, such as, for example, a silicon oxide layer is formed in a manner to cover the third layer. As shown in FIG. 14 and FIG. 15, the interlayer dielectric layer 85 is processed by CMP for planarization. A plurality of through holes 83 are formed in the interlayer dielectric layer 85, which expose the BL contact pad layers 45a and the like. Plugs 81 are embedded in the through holes 83. They are shown in a plan view in FIG. 13. As shown in FIG. 13, the plugs 81 are connected to the BL contact pad layers 45a and 45b, the $V_{SS}$ contact pad layer 47 and $V_{DD}$ contact pad layer 49. The plugs 81 have patterns shown in plan view of FIG. 9. Tungsten, for example, can be used as a material for the plugs 81. The diameter of the through hole 83 at its upper end section is, for example, 0.36 μm, and at its lower end section is, for example, 0.28 μm.

{Fourth Layer}

The fourth layer is structurally located above the structure shown in FIG. 13. As shown in FIG. 10, a plurality of bit lines 51, a plurality of bit lines 53, a plurality of $V_{SS}$ wirings 55 and the $V_{DD}$ wirings 57 are disposed in the fourth layer. The $V_{SS}$ wiring 55 is interposed between the bit line 51 and the bit line 53, and disposed in a center of the memory cell. Each one of the $V_{DD}$ wirings 57 is disposed for, for example, every thirty-two (32) memory cells arranged in the X-axis direction. They linearly extend in the Y-axis direction in FIG. 10. They are connected to the plugs 81 shown in FIG. 13, respectively. The connected sections are shown in FIG. 10 as contact sections 81m. The bit lines 51 have a structure in which, for example, from the bottom layer, a titanium nitride layer, an aluminum-copper alloy layer, and a titanium nitride layer are successively stacked in layers.

FIG. 14 is a cross-sectional view of the fourth layer shown in FIG. 10 taken along plane B1–B2. The bit line 53 appears in the cross-sectional view. A signal that is complementary to the signal flown through the bit line 51 flows through the bit line 53. The above is a detailed structure of the embodiment of the present invention.

It is noted that the patterns shown in FIGS. 1 through 13 are designed patterns. These patterns have corner sections. However, in patterns that are actually formed on a semiconductor substrate, lines that define the corner sections are curved due to the light proximity effect.

Advantages of the Present Embodiment

Advantages of the present embodiment are described below.

Figure 17:
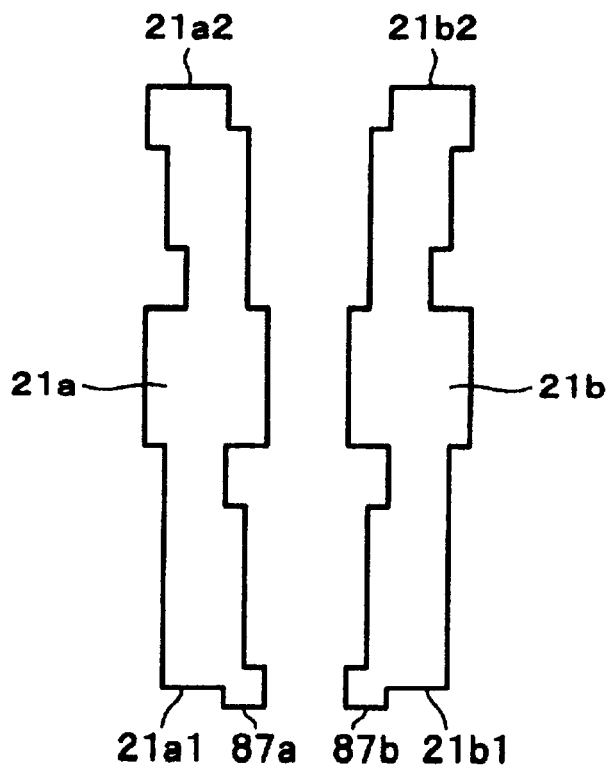
FIG. 17 is a plan view of mask patterns for gate electrode layers in accordance with one embodiment of the present invention.

{1} In accordance with the present embodiment, devices to correct the light proximity effect do not need to be added to the end section 21a2 of the gate electrode layer 21a and the end section 21b2 of the gate electrode layer 21b shown in FIG. 11. Prior to explaining the reasons, first, the correction of light proximity effect is described. Due to the light proximity effect, a resist pattern may not be formed faithfully with respect to the designed pattern. By correcting the light proximity effect, the resist pattern is made to be as close to the designed pattern as much as possible. For example, shelves are used as devices to correct the light proximity effect. FIG. 17 shows mask patterns for the gate electrode layers 21a and 21b that have shelves added thereto. More specifically, a shelf 87a is added to the end section 21a1 of the gate electrode layer 21a, and a shelf 87b is added to the end section 21b1 of the gate electrode layer 21b.

Next, the reason why shelves do not need to be added to the end sections 21a2 and 21b2 in the present embodiment is described. As shown in FIG. 11, the source contact layers 61b of the load transistors $Q_5$ and $Q_6$ (the source contact layers 61b are the plugs 61 located in the p$^+$ type source region 13a1) are located adjacent the end sections 21a2 and 21b2 of the gate electrode layers 21a and 21b, and the both end sections 21a2 and 21b2 bend outwardly to avoid contact with the source contact layer 61b. In this manner, in accordance with the present embodiment, the end sections 21a2 and 21b2 bend outwardly, and the shape of the end sections 21a2 and 21b2 corrects the light proximity effect. As a result, in accordance with the present embodiment, proximity effect correction devices such as shelves, does not need to be added to the end sections 21a2 and 21b2.

It is noted that the present embodiment has a structure in which the end sections 21a2 and 21b2 are bent outwardly. However, the end sections 21a2 and 21b2 can be formed into the shape of the end sections 21a1 and 21b1. If the light proximity effect needs to be corrected, shelves may be added to the end sections 21a1 and 21b1.

{2} In accordance with the present embodiment, as shown in FIG. 11, as a result of outwardly bending the end sections 21a1 and 21b1, areas of the gate electrode layers 21a and 21b on the outside of the channel regions of the load transistors $Q_5$ and $Q_6$ (on the side of the source contact regions of the load transistors) can be made larger. Therefore, even when there is an alignment error, the gate electrode layers 21a and 21b can cover the channel regions of the load transistors $Q_5$ and $Q_6$, and therefore an increase in the channel leak current at the load transistors $Q_5$ and $Q_6$ can be prevented.

{3} In accordance with the present embodiment, the size of an SRAM can be reduced because of the following reasons. In accordance with the present embodiment, data is stored by the flip-flops of the memory cells. A flip-flop is formed by connecting an input terminal (a gate electrode) of one inverter to an output terminal (a drain) of the other inverter, and connecting an input terminal (a gate electrode) of the other inverter to an output terminal (a drain) of the one inverter. In other words, a flip-flop cross-couples a first inverter and a second inverter. Therefore, when a flip-flop is formed with two layers, for example, drain-drain connection layers that connect drains of inverters, and drain-gate connection layers that connect gates of the inverters to the drains of the inverters, may be formed in one conduction layer to allow cross-couple connections.

However, in the structure described above, the conduction layer is formed extending across a region where the drains of one inverter are located, a region where the gates of the other inverter are located and a region that connects these regions. The conduction layer may present a pattern having three end sections (for example, a pattern having branch sections such as a T-letter shape or an h-letter shape) or spiral patterns with their arm sections intertwined. For example, patterns having a T-letter shape are described in FIG. 1 of Japanese Patent Application Laid-Open No. 10-41409. Patterns having an h-letter shape are described, for example, in FIG. 4(b) on page 203 of IEDM Tech. Digest (1998) by Ishida, et al. Patterns having a spiral shape are described in FIG. 3(b) on page 203 of IEDM Tech. Digest (1998) by Ishida, et al. Such complicated patterns are difficult to accurately reproduce required shapes in the photo-etching process as the patterns are miniaturized, and cannot provide the required patterns and therefore become a hindrance to an attempt to reduce the memory cell size.

In accordance with the present embodiment, as shown in FIG. 1, gate electrode layers (21a and 21b) that define gates of CMOS inverters, drain-drain connection layers (31a and 31b) that connect drains of the CMOS inverters, and drain-gate connection layers (41a and 41b) that connect gates of one of the CMOS inverters and the drains of the other of the CMOS inverters are formed in different layers, respectively. Therefore, three layers are used to form a flip-flop. As a result, patterns in each layer can be simplified (for example, into linear shapes) compared to the case in which two layers are used to form a flip-flop. In this manner, in accordance with the present invention, since patterns in each layer can be simplified, for example, a miniaturized SRAM having a memory cell size of 4.5 $\mu m^2$ can be manufactured in the 0.18 $\mu m$ process generation.

{4} In accordance with the present embodiment, memory cells can also be reduced in size for the following reasons. The terms "gate electrode interlayer region" are used in describing the reasons. First, these terms are described and then the reasons are described. Referring to FIG. 11, a gate electrode interlayer region is a region between the gate electrode layer 21a and the gate electrode layer 21b. In other words, it is a region defined by the gate electrode layer 21a, a line connecting the end section 21a1 of the gate electrode layer 21a and the end section 21b1 of the gate electrode layer 21b, the gate electrode layer 21b, and a line connecting the end section 21b2 of the gate electrode layer 21b and the end section 21a2 of the gate electrode layer 21a.

Referring to FIG. 11, the reasons are described. In an SRAM memory cell, a current for reading the cells on the order of 100 $\mu A$ flows through the driver transistors $Q_3$ and $Q_4$. Therefore, a parasitic resistance in the $n^+$ type source region 11a1 of the driver transistors $Q_3$ and $Q_4$ need to be lowered. On the other hand, while the load transistors $Q_5$ and $Q_6$ that function to maintain a cell node high potential side can have a smaller current capacity, an off-leak current thereof needs to be reduced.

In accordance with the present embodiment, the distance $d_1$ between the gate electrode layer 21a and the gate electrode layer 21b on the side where the driver transistors $Q_5$ and $Q_6$ are located (0.2–0.4 $\mu m$) is shorter than the distance $d_2$ between the gate electrode layer 21a and the gate electrode layer 21b on the side where the load transistors $Q_3$ and $Q_4$ are located (0.41–0.6 $\mu m$). Further, in the present embodiment, the distance $d_2$ is set to be sufficient to dispose therein the source contact layer 61a of the driver transistor (where the source contact layer 61a is the plug 61 located in the $n^+$ type source region 11a1). Also, in the present embodiment, the source contact layer 61b (where the source contact layer 61b is the plug 61 located in the $p^+$ type source region 13a1) is not located in the gate electrode interlayer region, such that the distance $d_1$ can be shortened to a minimum value on the design rule.

Therefore, in accordance with the present embodiment, since the parasitic resistance of the $n^+$ type source region 11a1 of the driver transistors $Q_3$ and $Q_4$ can be reduced, high and stable operation can be realized. Also, a channel section and an area on the drain-side of the load transistors $Q_5$ and $Q_6$ can be provided with wide regions because the distance between the gate electrode layer 21a and the gate electrode layer 21b is short. As a result, the channel length of the load transistors $Q_5$ and $Q_6$ can be made longer than that of the driver transistors. Accordingly, the leak current resulting from the short-channel effect of the load transistors $Q_5$ and $Q_6$ can be reduced. As a result, in accordance with the present embodiments, the memory cell region can be effectively utilized, with the result that, while the characteristics are enhanced for lower current consumption and more stable operation, the memory cell can be further miniaturized.

It is noted that, in accordance with the present embodiment, the source contact layer 61b is not located in the gate electrode interlayer region. However, the source contact layer 61b can be located in the gate electrode interlayer region. Also, in the present embodiment, the source contact layer 61a is located in the gate electrode interlayer region. However, the source contact layer 61a may not have to be located in the gate electrode interlayer region.

{5} In accordance with the present embodiment, the memory cell can also be miniaturized for the following reasons. Generally, p-channel type transistors have a greater short-channel effect (that leads to an increased punch-through current and an increased leak current in the sub-threshold region) than n-channel type transistors. In order to suppress the leak by the short-channel effect, the gate length of the p-channel type transistor needs to be made longer than the gate length of the n-channel type transistor. In the embodiment shown in FIG. 11, since the load transistors $Q_5$ and $Q_6$ are p-channel type, the load transistors $Q_5$ and $Q_6$ have some extra area on their drain region side even when the gate length of the load transistors $Q_5$ and $Q_6$ is made longer. As a result, the current consumption can be lowered without increasing the memory cell area.

{6} As shown in FIG. 11, in accordance with the present embodiment, since the source contact layer 61a of the driver transistors $Q_3$ and $Q_4$ is positioned within the gate electrode interlayer region, the distance between the channel section of the driver transistors $Q_3$ and $Q_4$ and the source contact layer 61a becomes relatively short, such that the parasitic resistance at the n+ type source region 11a1 can be reduced. At the same time, the source contact layer 61a of the driver transistors $Q_3$ and $Q_4$ is disposed in the center of the memory cell, and does not commonly share the source contact layer with adjacent memory cells. As a result, a current, that flows through the source contact layer 61a at the time of a data reading operation, is always for one cell, and an operation current of adjacent memory cells does not flow in the source contact layer 61a. As a result, in accordance with the present embodiment, an increase in the potential on the source terminal, which may be caused by the parasitic resistance in the n+ type source region 11a1 of the driver transistors $Q_3$ and $Q_4$ and the reading current, can be reduced, and therefore high speed operation and stable operation can be realized. Also, since the source contact layer 61a is located within the gate electrode interlayer region, the source contact layer 61a of the driver transistors $Q_3$ and $Q_4$ does not have to be considered in connection to the placement of the auxiliary word lines 23, and the auxiliary word lines 23 can have linear layouts. Accordingly, in accordance with the present embodiment, the process on the auxiliary word lines 23 can be facilitated, and deviations in the width dimensions of the auxiliary word lines 23 (the channel lengths of the transfer transistors) can be reduced. Also, in accordance with the present embodiment, higher operation speed can be realized because the resistance of the auxiliary word lines 23 can be reduced.

It is noted that the present embodiment has a structure in which the word lines include the auxiliary word lines 23 (see FIG. 3) and the main word lines 43 (see FIG. 8). However, the present embodiment can have a structure in which main word lines are not be provided, and the word lines may be disposed in places of the auxiliary word lines.

What is claimed is:

1. A semiconductor memory device, comprising:
   a memory cell including a first driver transistor, a second driver transistor, a first load transistor, a second load transistor, a first transfer transistor and a second transfer transistor;
   a first gate electrode layer; and
   a second gate electrode layer;
   wherein the first gate electrode layer includes gate electrodes of the first driver transistor and the first load transistor,
   the second gate electrode layer includes gate electrodes of the second driver transistor and the second load transistor,
   the first gate electrode layer and the second gate electrode layer each have a linear pattern and are disposed in parallel with each other, and
   distances between the first gate electrode layer and the second gate electrode layer on a side adjacent the load transistors and on another side adjacent the driver transistors are different from each other.

2. The semiconductor memory device according to claim 1, wherein the distance between the first gate electrode layer and the second gate electrode layer on the side adjacent the load transistors is shorter than the distance between the first gate electrode layer and the second gate electrode layer on the other side adjacent the driver transistors.

3. The semiconductor memory device according to claim 2, wherein a source contact layer for the load transistors is located adjacent to end sections of the first and second gate electrode layers on the side adjacent the load transistors, and
   the end sections bend outwardly to avoid contact with the source contact layer for the load transistors.

4. The semiconductor memory device according to claim 2, wherein a distance between the first gate electrode layer and the second gate electrode layer on the side adjacent the load transistors is a minimum value on the design rule.

5. The semiconductor memory device according to claim 2, wherein the load transistors are p-channel type.

6. The semiconductor memory device according to claim 2, wherein a source contact layer for the driver transistors is located in a gate electrode interlayer region defined by a region between the first gate electrode layer and the second gate electrode layer.

7. The semiconductor memory device according to claim 1, further comprising first and second drain-drain connection layers and first and second drain-gate connection layers, wherein
   the gate electrode layers, the drain-drain connection layers and the drain-gate connection layers are located in different layers,
   in plan view, the first and second gate electrode layers are located between the first drain-drain connection layer and the second drain-drain connection layer,
   the first drain-drain connection layer connects a drain region of the first driver transistor and a drain region of the first load transistor,
   the second drain-drain connection layer connects a drain region of the second driver transistor and a drain region of the second load transistor,
   the first drain-gate connection layer connects the first drain-drain connection layer and the second gate electrode layer, and
   the second drain-gate connection layer connects the second drain-drain connection layer and the first gate electrode layer.

8. The semiconductor memory device according to claim 7, wherein
   the first and second driver transistors are n-type,
   the first and second load transistors are p-type, and
   the first and second transfer transistors are n-type,
   and further comprising first, second, third and fourth conduction layers, wherein
   the first gate electrode layer, the second gate electrode layer and an auxiliary word line are located in the first conduction layer,
   the first drain-drain connection layer, the second drain-drain connection layer, a power supply line, a first contact pad layer, a second contact pad layer and a third contact pad layer are located in the second conduction layer,
   the first drain-gate connection layer, the second drain-gate connection layer, a main word line, a fourth contact pad layer, a fifth contact pad layer and a sixth contact pad layer are located in the third conduction layer,
   a first bit line, a second bit line and a grounding line are located in the fourth conduction layer,
   the auxiliary word line extends in a first direction, the power supply line connects to source regions of the load transistors, the first contact pad layer is used to connect the first bit line and a source/drain region of the first transfer transistor, the second contact pad layer is used to connect the second bit line and a source/drain region of the second transfer transistor, the third contact pad layer is used to connect source regions of the driver transistors and the grounding line, the main word line extends in the first direction, the fourth contact pad layer is used to connect the first bit line and the source/drain region of the first transfer transistor, the fifth contact pad layer is used to connect the second bit line and the source/drain region of the second transfer transistor, the sixth contact pad layer is used to connect the source regions of the driver transistors and the grounding line, and the first and second bit lines extend in a second direction which is perpendicular to the first direction.

9. The semiconductor memory device according to claim 7, wherein the first drain-drain connection layer and the second drain-drain connection layer have linear patterns, and the first gate electrode layer, the second gate electrode layer, the first drain-drain connection layer and the second drain-drain connection layer are disposed in parallel with one another.

10. The semiconductor memory device according to claim 1, wherein the memory cell has a size of 4.5 $\mu m^2$ or less.

* * * * *